(12) United States Patent
Chou et al.

(10) Patent No.: US 7,450,424 B2
(45) Date of Patent: Nov. 11, 2008

(54) METHOD FOR READING A MEMORY ARRAY WITH A NON-VOLATILE MEMORY STRUCTURE

(75) Inventors: Ming-Hung Chou, Hsinchu (TW); Fuja Shone, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 176 days.

(21) Appl. No.: 11/669,169

(22) Filed: Jan. 31, 2007

(65) Prior Publication Data

US 2008/0181013 A1 Jul. 31, 2008

(51) Int. Cl.
*G11C 11/34* (2006.01)
(52) U.S. Cl. .............................. 365/185.18; 365/185.24; 365/185.05
(58) Field of Classification Search ............ 365/185.18, 365/185.05, 185.24
See application file for complete search history.

(56) References Cited

U.S. PATENT DOCUMENTS

| 4,302,766 A | 11/1981 | Guterman et al. |
| 4,331,968 A | 5/1982 | Gosney, Jr. et al. |
| 4,561,004 A | 12/1985 | Kuo et al. |
| 4,622,656 A | 11/1986 | Kamiya et al. |
| 4,803,529 A | 2/1989 | Masuoka |
| 5,414,693 A | 5/1995 | Ma et al. |
| 5,712,180 A | 1/1998 | Guterman et al. |
| 5,818,761 A * | 10/1998 | Onakado et al. ........ 365/185.18 |
| 7,006,379 B2 * | 2/2006 | Noguchi et al. ......... 365/185.17 |
| 7,154,783 B2 * | 12/2006 | Lee et al. ................ 365/185.11 |

* cited by examiner

*Primary Examiner*—Son Dinh
(74) *Attorney, Agent, or Firm*—Winston Hsu

(57) ABSTRACT

A method for reading a memory array is disclosed. The method includes turning on the column of select gates; pre-programming a first right floating gate to a high threshold and a first left floating gate coupled to a same first word line as the first right floating gate to a low threshold; charging a voltage of the right data line to a first predetermined value; charging a voltage of the first word line to a second predetermined value which is between the high threshold of the first right floating gate and the low threshold of the first left floating gate; charging a voltage of a second word line coupled to a second right floating gate to a third predetermined value; and comparing a current of the left data line with a fourth predetermined value.

6 Claims, 30 Drawing Sheets

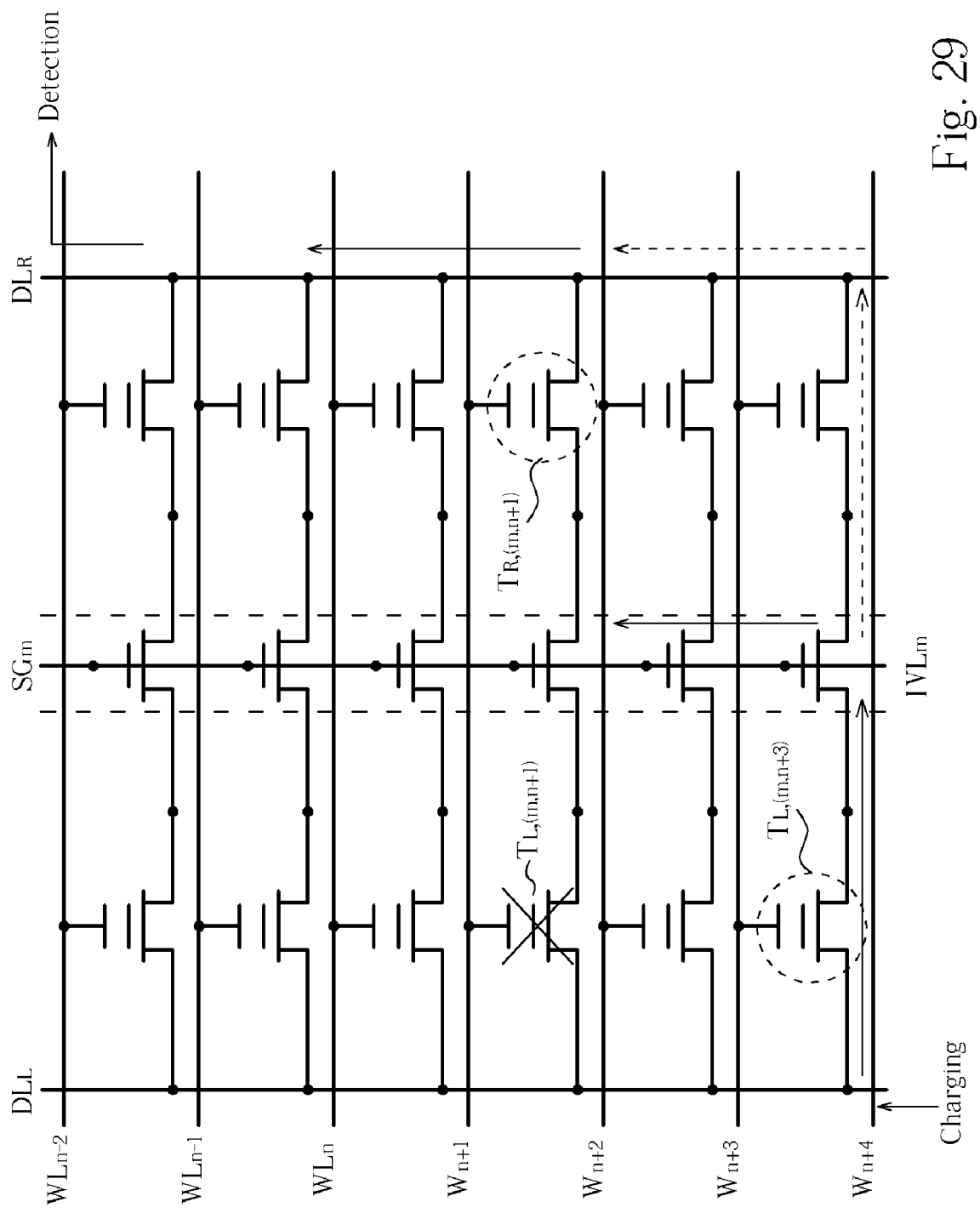

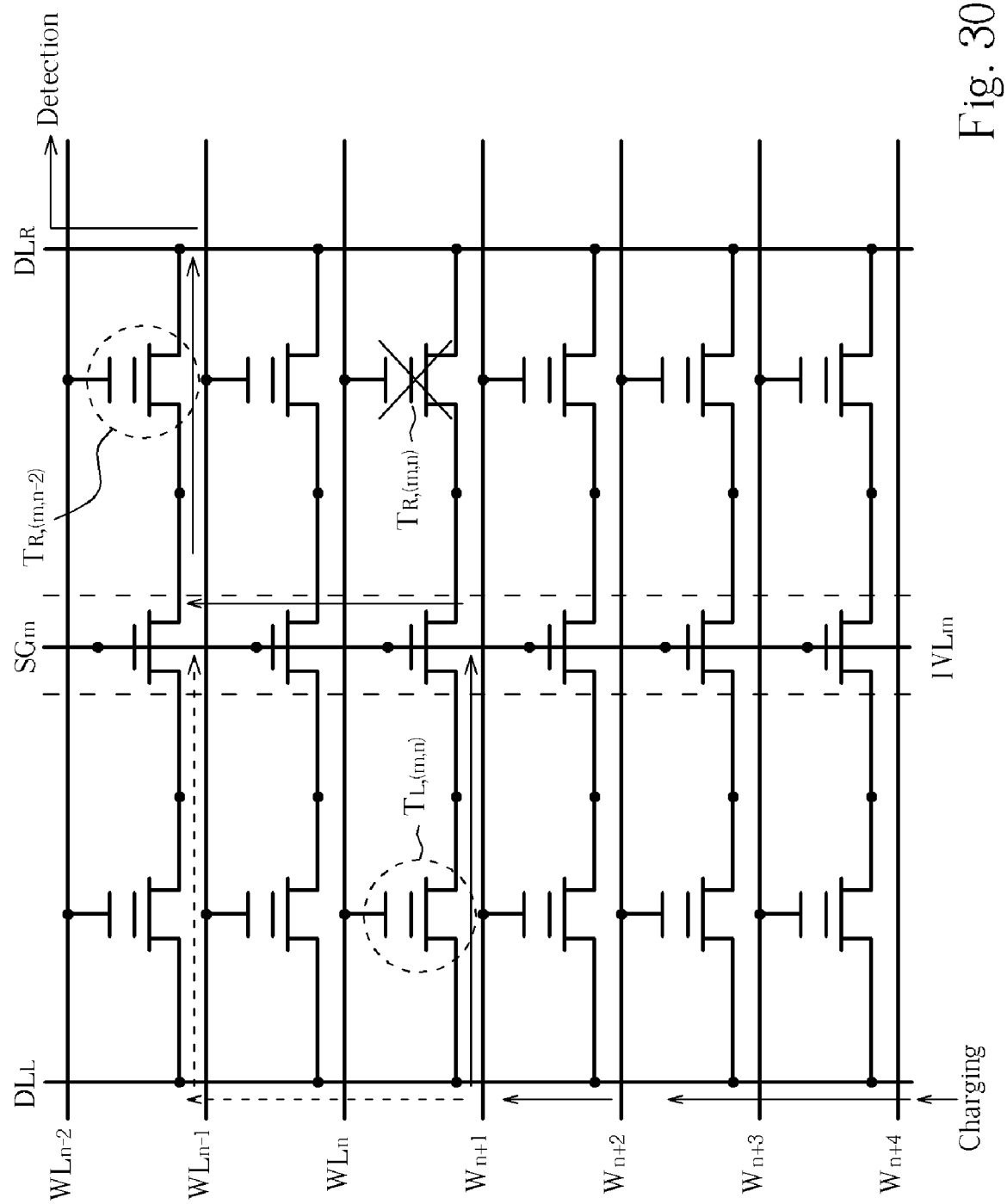

METHOD FOR READING A MEMORY ARRAY WITH A NON-VOLATILE MEMORY STRUCTURE

BACKGROUND OF THE INVENTION

1. Field of the Invention

The present invention is related to a method for reading a memory array with a non-volatile memory structure, and more particularly, to a method for reading a memory array of a symmetrical and self-aligned non-volatile memory structure with a high cell density and an improved coupling ratio.

2. Description of the Prior Art

Erasable programmable read only memories (EPROMs) and electrically erasable programmable read only memories (EEPROMs) are well known non-volatile memory devices capable of storing data, as well as erasing and rewriting data, as desired.

The conventional non-volatile memory cells normally need high currents to operate, e.g., 200 microamperes (μA), for hot electron programming, and are not suitable for low-power devices that are currently the trend of chip development. Therefore, one form of an EEPROM device includes a so-called "split-gate" electrode that has been developed to obtain high efficiency and low current programming, where the programming current can be diminished to, for example, 1 μA.

Many EEPROM devices use two polysilicon layers (one for the formation of the floating gate and another for the formation of the control gate and possible electrical interconnects) whereas other EEPROM devices use three polysilicon layers. For example, U.S. Pat. No. 4,302,766 provides a first polysilicon layer serving as the floating gate, a second polysilicon layer serving as the control gate, and a third polysilicon layer coupled through an erase window to a portion of the first polysilicon layer for use during erasure of the cell. U.S. Pat. No. 4,331,968 also uses a third layer of polysilicon to form an erase gate, and U.S. Pat. Nos. 4,561,004 and 4,803,529 use three polysilicon layers in their own specific configurations.

U.S. Pat. No. 4,622,656 describes an EEPROM device in which a reduced programming voltage is provided by having a highly doped channel region under the select gate, and having the channel region under the floating gate being either lightly doped or doped to the opposite conductivity type, thereby providing a significant surface potential gap at the transition location of the channel.

U.S. Pat. No. 5,712,180 discloses a flash EEPROM cell layout as shown in FIG. 1, and the cross-sectional diagram of line A-A in FIG. 1 is shown in FIG. 2. EEPROM cell 101 includes a buried source region 102 and a buried drain region 103, each being buried by a relatively thick layer of dielectric 104 and 105, respectively. Channel region 106 is divided into a first portion 106-1 and a second portion 106-2. The first portion 106-1 is influenced by the polysilicon layer 109 and serves as a select gate, whereas the second portion 106-2 is influenced by a floating gate 107 formed of a polysilicon layer and which, in turn, is influenced by control gate 108 formed of a polysilicon layer. As is well known in the art, suitable dielectric layers such as thermally grown oxide are located between channel 106, polysilicon layer 109, and polysilicon layer 107 for insulation. Similarly, suitable dielectric layers such as oxide or composite oxide/nitride are formed between the three layers of polysilicon. Metal silicide can be used in place of one or more of the polysilicon layers 108 and 109. If desired, a highly-doped P+ region 120 is used within channel 106-2 adjacent to buried drain region 103, so as to provide a stable threshold voltage of the memory transistor including channel 106-2.

U.S. Pat. No. 5,414,693 also discloses a flash EEPROM memory structure as shown in FIG. 3. The cell structure is formed in a P-doped substrate 206 with a drain 204 of a transistor 201 and a drain 205 of a transistor 202. The drains 204 and 205 serve as bit lines. The transistor 201 includes a floating gate 207a and an overlying control gate 208a. Likewise, the transistor 202 includes a floating gate 207b and a control gate 208b located thereon. A word line 209 extends over the two transistors 201 and 202 and forms the control gate 209a of the select gate between the floating gate transistors 201 and 202. The word line 209 serially connects the select gates in one row of a memory array and runs perpendicular to the bit lines in columns, i.e., the drains 204 and 205.

To sum up, the floating gates in U.S. Pat. No. 5,712,180 and U.S. Pat. No. 5,414,693 are completely defined by the control gates during control gate patterning, so the floating gates have to be larger than the select gate in width direction to allow alignment tolerance. Under such circumstances, the memory cell size could not be reduced significantly.

SUMMARY OF THE INVENTION

The present invention provides a method for reading a memory array. The memory array comprises a right data line, a left data line, a column of select gates having gates coupled together, a plurality of right floating gates each coupled between a corresponding select gate and the right data line, a plurality of left floating gates each coupled between a corresponding select gate and the left data line, and a plurality of word lines each coupled to a corresponding right floating gate and left floating gate. The method comprises turning on the column of select gates, preprogramming a first right floating gate to a high threshold and a first left floating gate coupled to a same first word line as the first right floating gate to a low threshold, charging a voltage of the right data line to a first predetermined value, charging a voltage of the first word line to a second predetermined value which is between the high threshold of the first right floating gate and the low threshold of the first left floating gate, charging a voltage of a second word line coupled to a second right floating gate to a third predetermined value, and comparing a current of the left data line with a fourth predetermined value.

The present invention further provides a method for reading a memory array. The memory array comprises a right data line, a left data line, a column of select gates having gates coupled together, a plurality of right floating gates each coupled between a corresponding select gate and the right data line, a plurality of left floating gates each coupled between a corresponding select gate and the left data line, and a plurality of word lines each coupled to a corresponding right floating gate and left floating gate. The method comprises turning on the column of select gates, preprogramming a first right floating gate to a high threshold and a first left floating gate coupled to a same first word line as the first right floating gate to a low threshold, charging a voltage of the right data line to a first predetermined value, charging a voltage of the first word line to a second predetermined value which is between the high threshold of the first right floating gate and the low threshold of the first left floating gate, charging a voltage of a second word line coupled to a second right floating gate to a third predetermined value, and comparing a voltage of the left data line with a fourth predetermined value.

The present invention further provides a method for reading a memory array. The memory array comprises a right data line, a left data line, a column of select gates having gates coupled together, a plurality of right floating gates each coupled between a corresponding select gate and the right data line, a plurality of left floating gates each coupled between a corresponding select gate and the left data line, and a plurality of word lines each coupled to a corresponding right floating gate and left floating gate. The method comprises turning on the column of select gates, preprogramming a first right floating gate to a high threshold and a first left floating gate coupled to a same first word line as the first right floating gate to a low threshold, charging a voltage of the left data line to a first predetermined value, charging a voltage of the first word line to a second predetermined value which is between the high threshold of the first right floating gate and the low threshold of the first left floating gate, charging a voltage of a second word line coupled to a second right floating gate to a third predetermined value, and comparing a current of the right data line with a fourth predetermined value.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 29 is a diagram illustrating a second embodiment of the method for reading the memory array of the present invention; and FIG. 30 is a diagram illustrating a third embodiment of the method for reading the memory array of the present invention.

DETAILED DESCRIPTION

Figure 1:
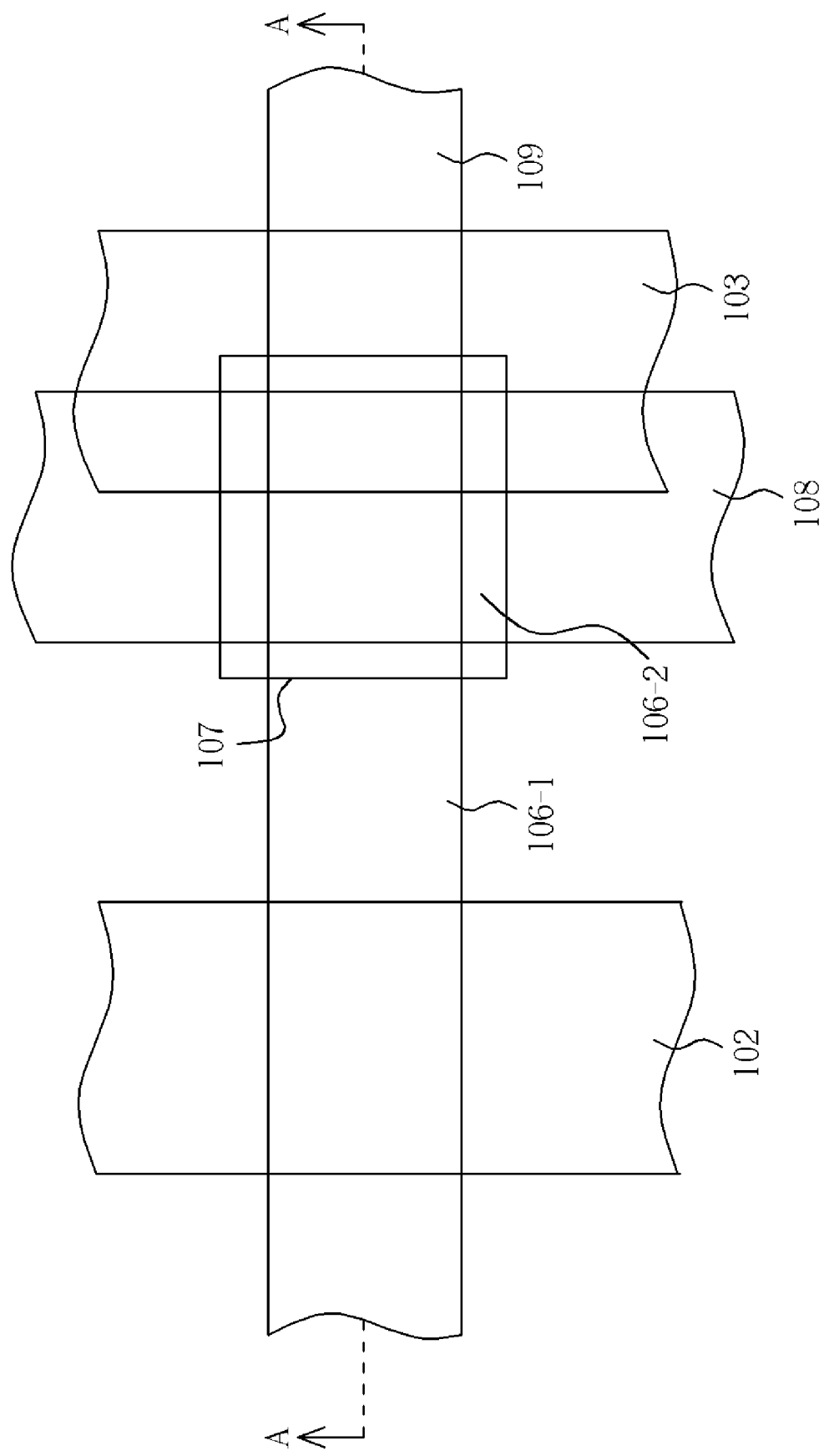
FIGS. 1 and 2 illustrate a known memory structure.
Figure 2:
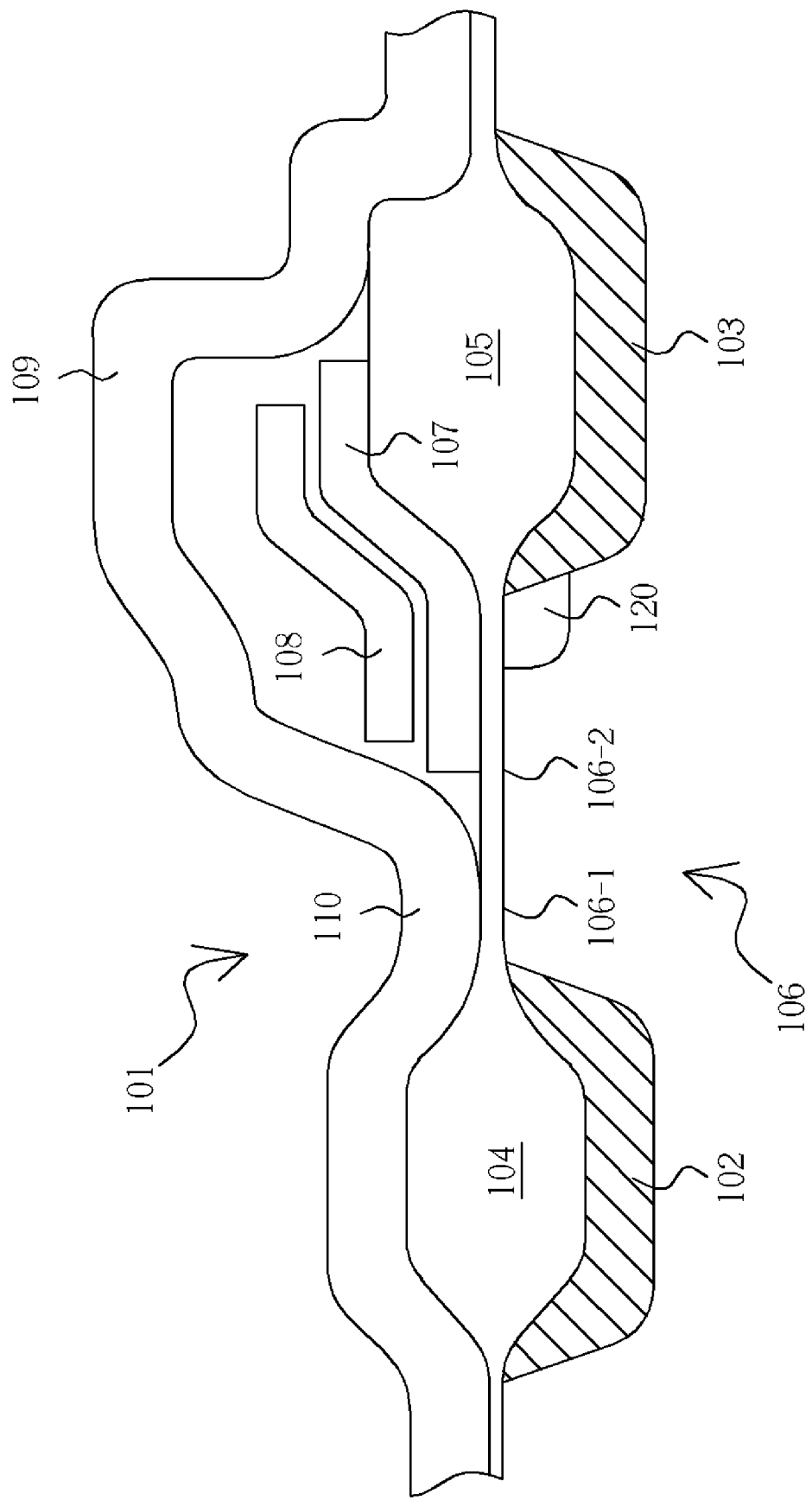
Figure 3:
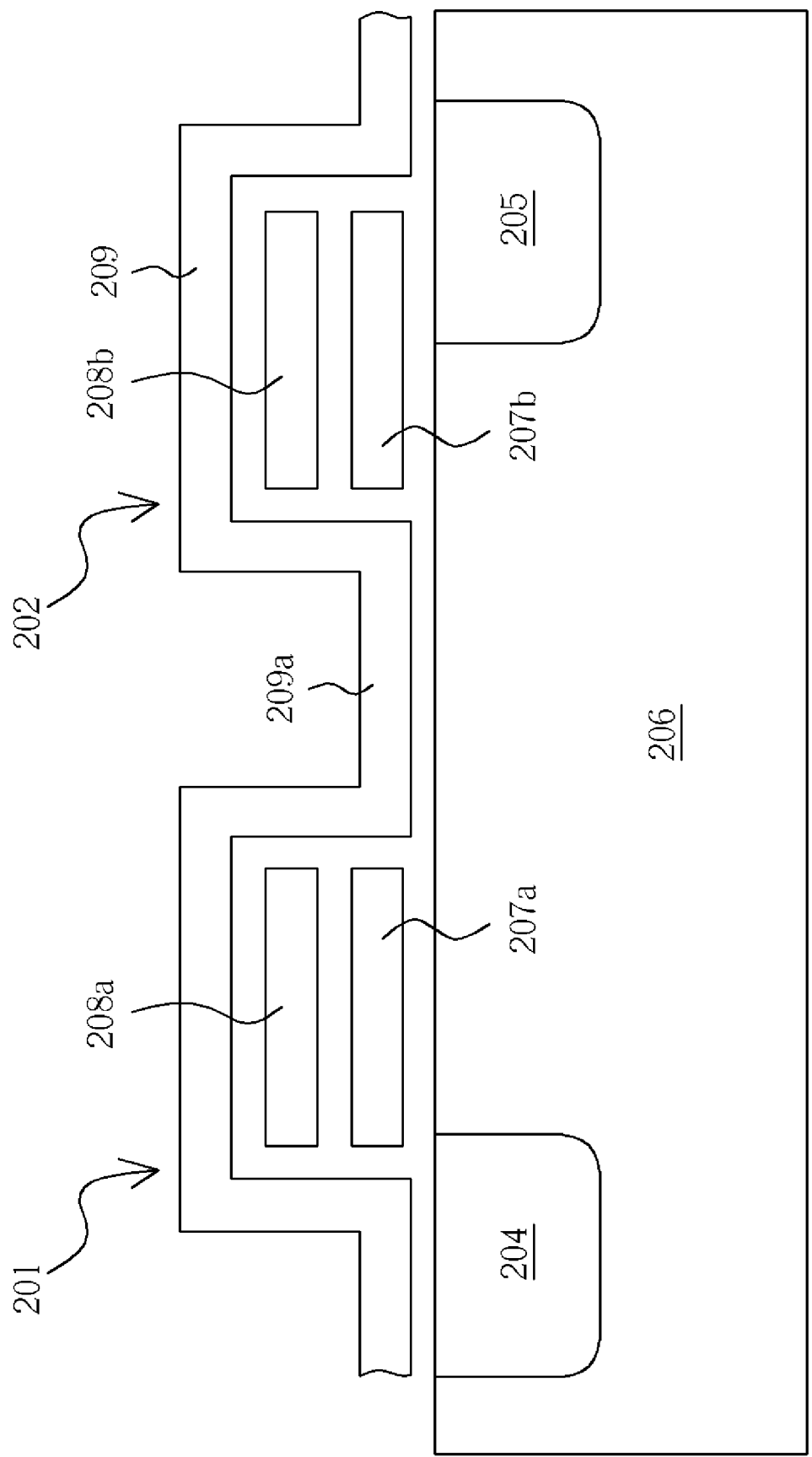
FIG. 3 illustrates another known memory structure.
Figure 4:
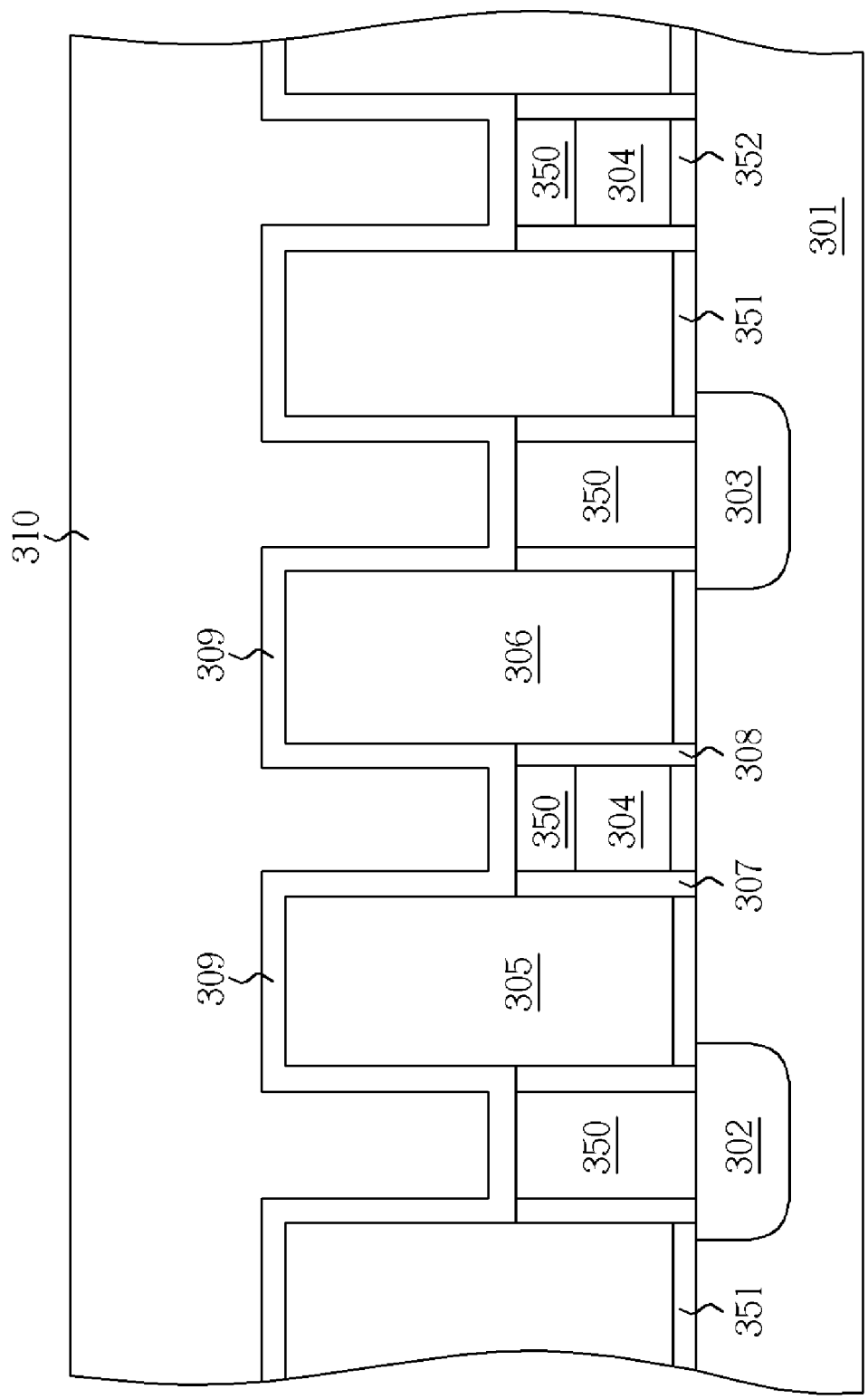
FIG. 4 illustrates a memory structure according to the present invention.

Please refer to FIG. 4, showing a memory structure according to the present invention. The memory structure is formed between two doping regions 302 and 303, which may comprise N+ dopants, e.g., arsenic ions with $1\times10E14$-$5\times10E15$ atoms/cm2, on a P-type well 301 in a semiconductor substrate. The semiconductor substrate may comprise a triple well, i.e. a P-well above an N-well for the memory cell area, an N-well for a PMOS area as a peripheral circuit, and a P-well for an NMOS area as a peripheral circuit. The memory structure also can be formed on a N-type well in a semiconductor substrate, according to the electrical properties as desired.

The memory structure comprises a conductive line 304 deposited above the P-type well 301 in the semiconductor substrate. The conductive line 304 may comprise conductive material such as polysilicon or polysilicon/tungsten silicide (poly/WSi) and have a thickness between 500-1000 angstroms. Two conductive blocks 305, 306, as charge storage regions, are formed at the two sides of the conductive line 304. There are spacers 307, 308 deposited between the two conductive blocks 305, 306 and the conductive line 304, respectively, for insulation. The spacers may range from 100 to 300 angstroms. It should be noted that the two conductive blocks 305, 306 each have a raised top and raised parts of sides relative to the top of the conductive line 304. That is, the thickness of the conductive block 305 or 306 is more than the thickness of the conductive line 304. The conductive block may comprise polysilicon. A dielectric layer 309, which may comprise oxide or oxide/nitride/oxide (ONO), is deposited on the tops and partial sides of the two conductive blocks 305, 306, the conductive line 304, and the doping regions 302, 303. A conductive line 310 is formed on the first dielectric layer 309, with a part deposited in an indent between the two conductive blocks 305, 306, as the thickness of the conductive blocks 305, 306 is more than the thickness of the conductive line, and the conductive line 310 is substantially perpendicular to the conductive lines 304 and the doping regions 302, 303, respectively.

The conductive line 304 and the conductive blocks 305, 306 serve as a select gate and floating gates, respectively, such that the floating gates each have a thickness more than the thickness of the select gate, and thus the coupling ratio is improved. The doping regions 302, 303 and the conductive line 310 serve as bit lines and a word line, respectively. A second dielectric layer 351, which may comprise oxide or oxide/nitride/oxide and range from 70 to 110 angstroms, may be deposited between the conductive blocks 305, 306 and the semiconductor substrate. A third dielectric layer 352 may be deposited between the conductive line 304 and the semiconductor substrate. The conductive line may further comprise a cap layer comprising dielectric material 350, such that the cap layer is between the conductive line 304 and the first dielectric layer 309. There is further a layer of dielectric material 350 disposed between the doping regions 302, 303 and the first dielectric layer 309.

Further, with a view to increasing the word line integrity, a third conductive line substantially parallel to the second conductive line may be formed and insulated from the conductive line 310 with a dielectric spacer. A dielectric may be located between the third conductive line and the semiconductor substrate. As a result, the word line density will be almost doubled.

Figure 5:
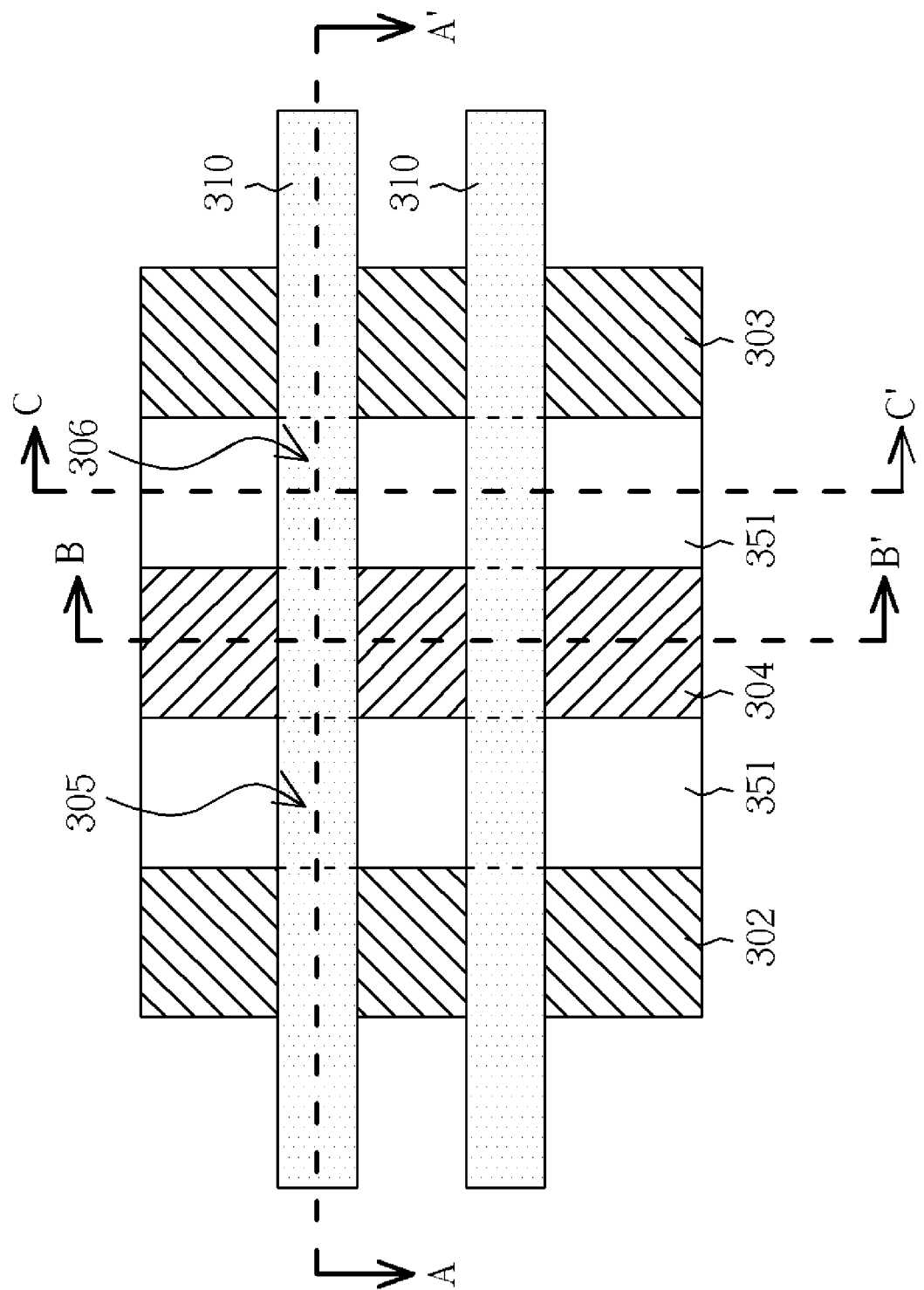
FIG. 5 illustrates an array layout in a top view of the memory structure shown in FIG. 4.

FIG. 5 shows a top view of the memory cell in FIG. 4. It should be noted that the conductive line 310 (word line) is perpendicular to the doping region 302 or 303 as a buried diffusion region (bit line), and the conductive line 304 as a select gate. The floating gates 305 and 306 represent as conductive blocks under the lines 310. Lines AA', BB', and CC' are cross-sectional lines for showing the cross sections of the memory cell, the select gate, and the floating gate, respectively.

Figure 6:
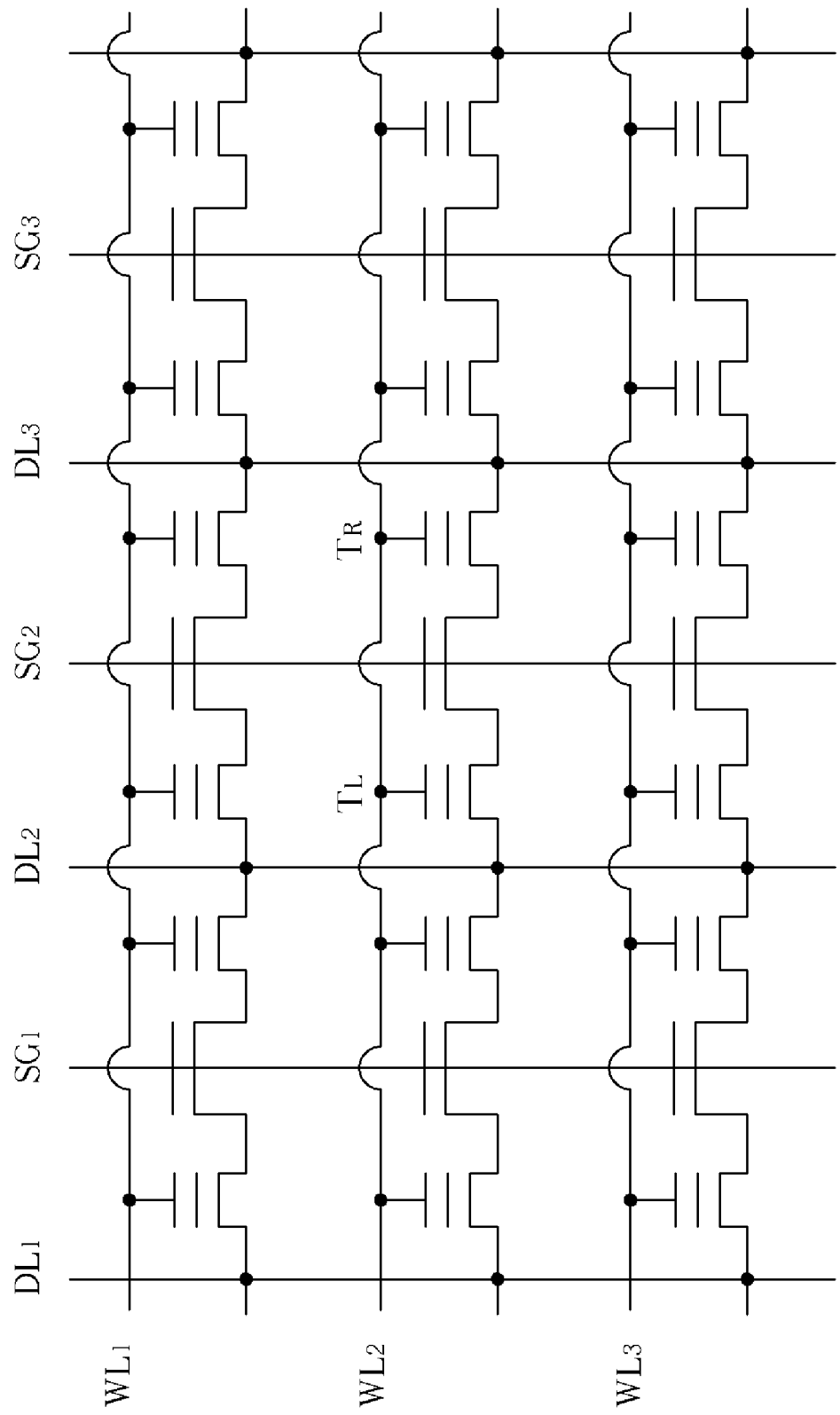
FIG. 6 illustrates the circuit schematic with reference to the memory array according to the present invention.

FIG. 6 illustrates the circuit schematic with reference to the memory structure in accordance with the present invention. Yet some components are renamed by their functionality: a data line (bit line) is denoted by DLx, a select gate is denoted by SGx, and a word line is denoted by WLx. Floating gate cells at two sides of a select gate SG2 are denoted by TL and TR, respectively.

Figure 7:
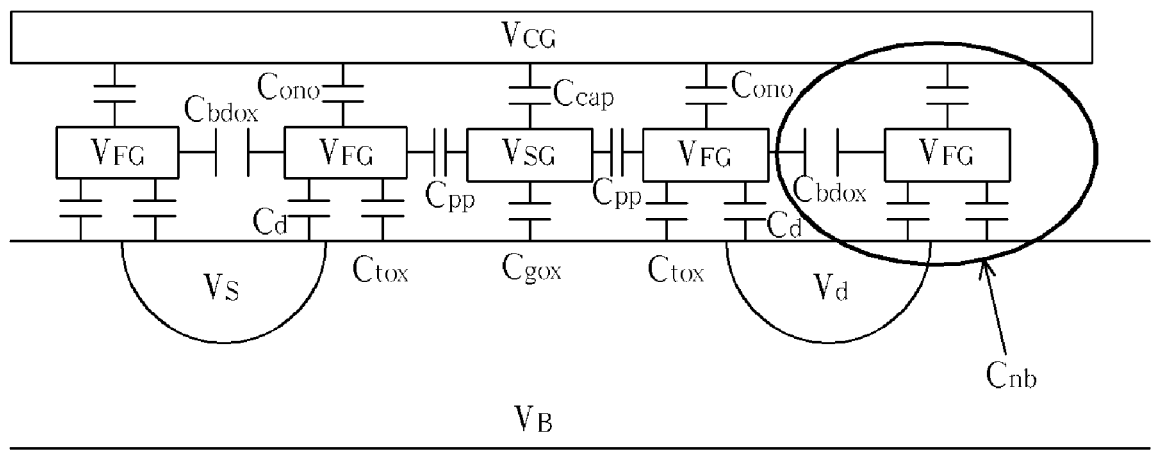
FIG. 7 illustrates the equivalent capacitive model with reference to the memory cell according to the present invention.
Figure 7:
Figure 7:
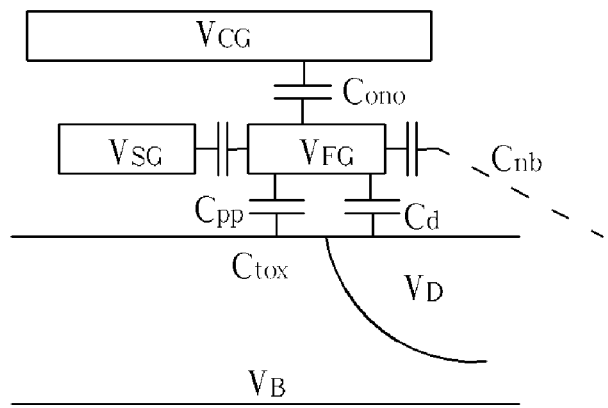

FIG. 7 shows an equivalent capacitive model and the simplified capacitive model of the memory structure according to the present invention. For floating gate voltage, VFG, as:

Ctot=Cono+Ctox+Cd+Cpp+Cnb in which,

Ctot: total capacitance

Cono: oxide/nitride/oxide layer capacitance

Ctox: tunnel oxide layer capacitance

Cd: drain capacitance

Cpp: select gate capacitance

Cnb: neighbor capacitance, including buried line oxide layer capacitance Cbdox while, substrate coupling ratio, $\alpha B=Ctox/Ctot$ gate coupling ratio, $\alpha CG=Cono/Ctot$ drain coupling ratio, $\alpha D=Cd/Ctot$ SG coupling ratio, $\alpha PP=Cpp/Ctot$ therefore, $VFG=\alpha B*Vb+\alpha CG*Vcg+\alpha D*Vd+\alpha PP*Vsg$ in which, VFG: floating gate voltage Vb: substrate voltage Vcg: control gate voltage Vd: drain voltage Vsg: select gate voltage In view of the equation listed above, usually, the potential across tunnel oxide layer is hoped to be as high as possible, and therefore, Cono is hoped to be as high as possible, and Cnb is as low as possible. Ctox, Cd, and Cpp are determined by the cell requirement, and can only be tuned in a small range. Assuming Cnb can be ignored, when the dielectric layer between the control gate and the floating gate has an increased area, the gate coupling ratio will be increased, and in turn, the floating gate voltage will increase. In the present invention, the floating gate 305 or 306 is formed to raise the height (the thickness), thus it has a relatively large area for dielectric layer 309 formation to increase the coupling ratio. The layer of dielectric material 350 above the doping region 303 comprises no conductive layers, such that the neighbor coupling can be minimized and be ignored.

A process for making a memory cell of the NMOS type in a first embodiment is exemplified as follows.

Figure 8:
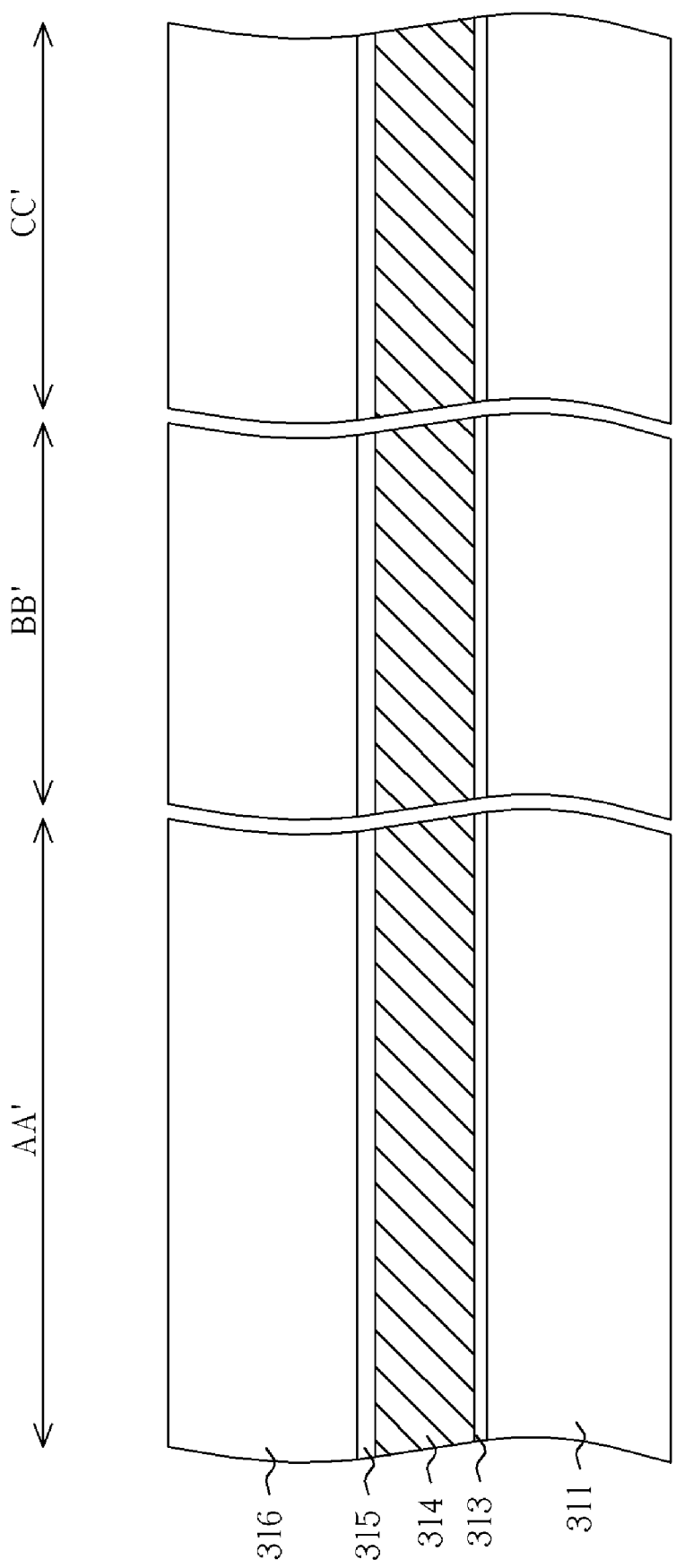
FIGS. 8 through 15 illustrate the processes of manufacturing the memory structure in one embodiment according to the present invention.

FIGS. 8-15 show the cross-sectional diagrams of lines AA', BB', and CC' as shown in FIG. 5, respectively, during the manufacturing process for the memory structure. As shown in FIG. 8, a semiconductor substrate is provided. A gate dielectric layer 313 may be first thermally grown on the surface of the semiconductor substrate, and followed by sequentially deposition of a conductive layer 314 and a mask layer comprising a cap layer of TEOS 315 and a cap layer of SiN 316.

Figure 9:
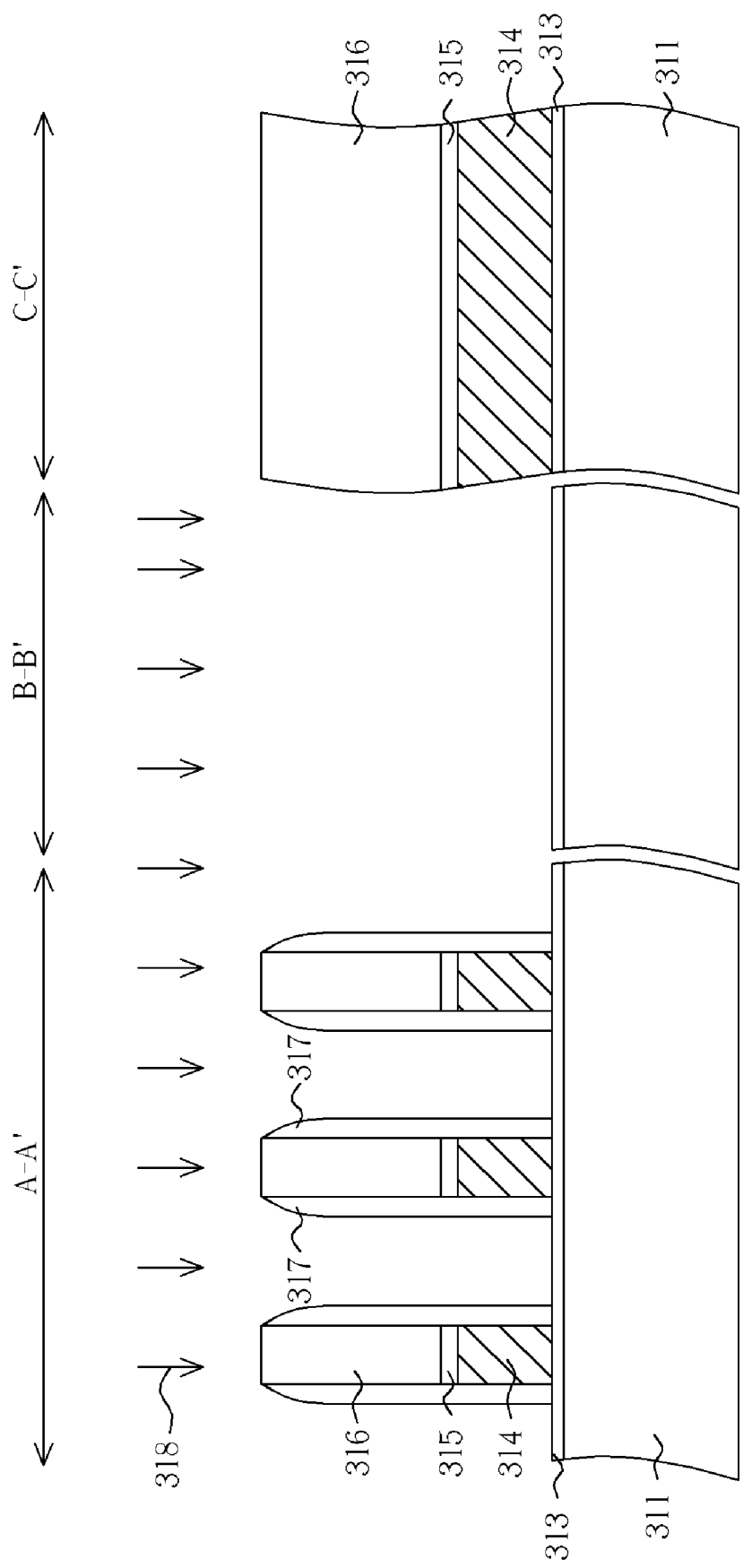

As shown in FIG. 9, a lithography process and an etching process are performed to remove a portion of the cap layer of TEOS 315, the cap layer of SiN 316, and the conductive layer 314 to define a plurality of conductive lines, which will serve as floating gates finally. The conductive line comprises an upper part including a cap layer of TEOS 315 and a cap layer of SiN 316 as a mask layer, and a lower part comprising the conductive layer 314. Next, an oxide layer is deposited on the semiconductor substrate to fill the trenches between the conductive lines by either oxidation or deposition of low pressure chemical vapor deposition (LPCVD) oxide, or high temperature oxide (HTO), and followed by etching back process, such as an anisotropic etching process, to form a spacer 317 at each side of the conductive blocks. Subsequently, an ion implanting step 318 is performed to give the memory structure a threshold voltage.

Figure 10:
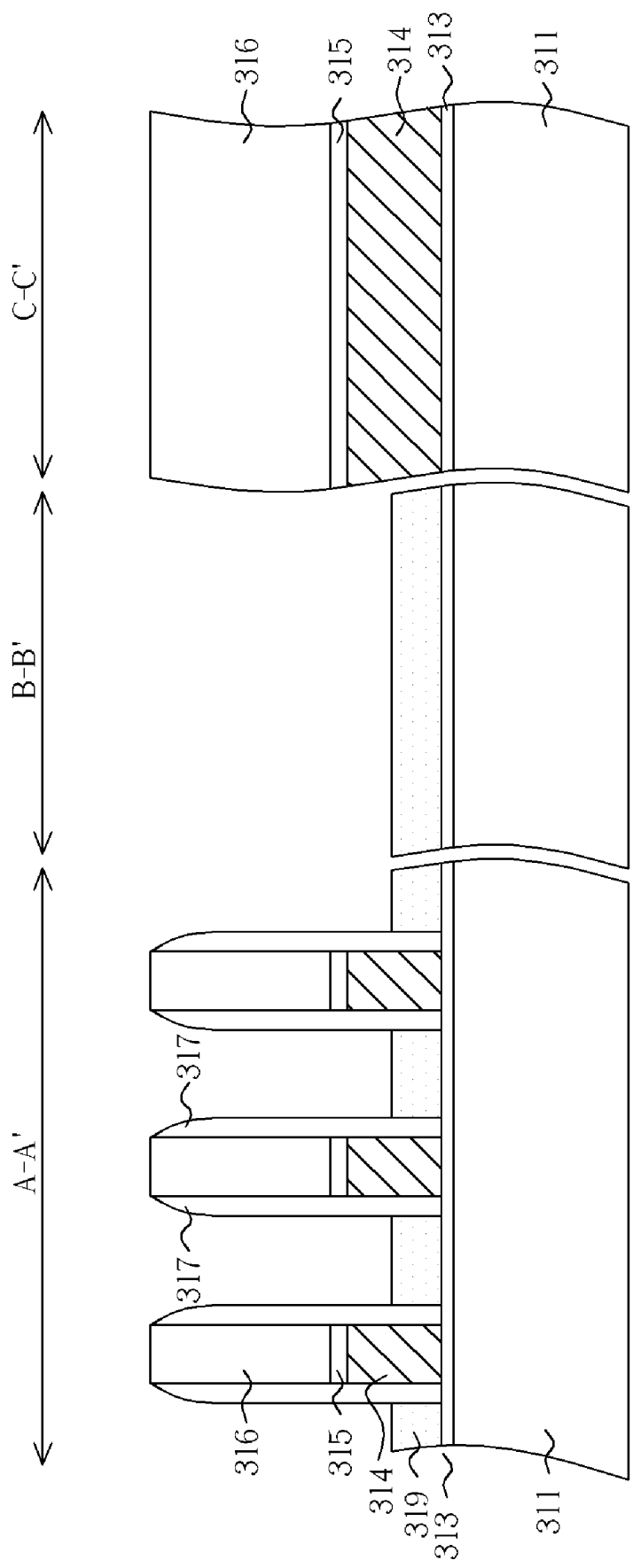

As shown in FIG. 10, a dielectric layer as a gate oxide layer may be further formed on the exposed semiconductor substrate for insulation of the select gate formed later on and the semiconductor substrate. Next, a conductive layer on the semiconductor substrate between every two conductive lines is formed by depositing a conductive material on the dielectric layer and the conductive blocks, chemically mechanically polishing the layer of the conductive material using the top of the conductive block as a stop layer, and etching back the layer of the conductive material to form a plurality of conductive lines 319 with a thickness less than the conductive layer 314 of the conductive lines.

Figure 11:
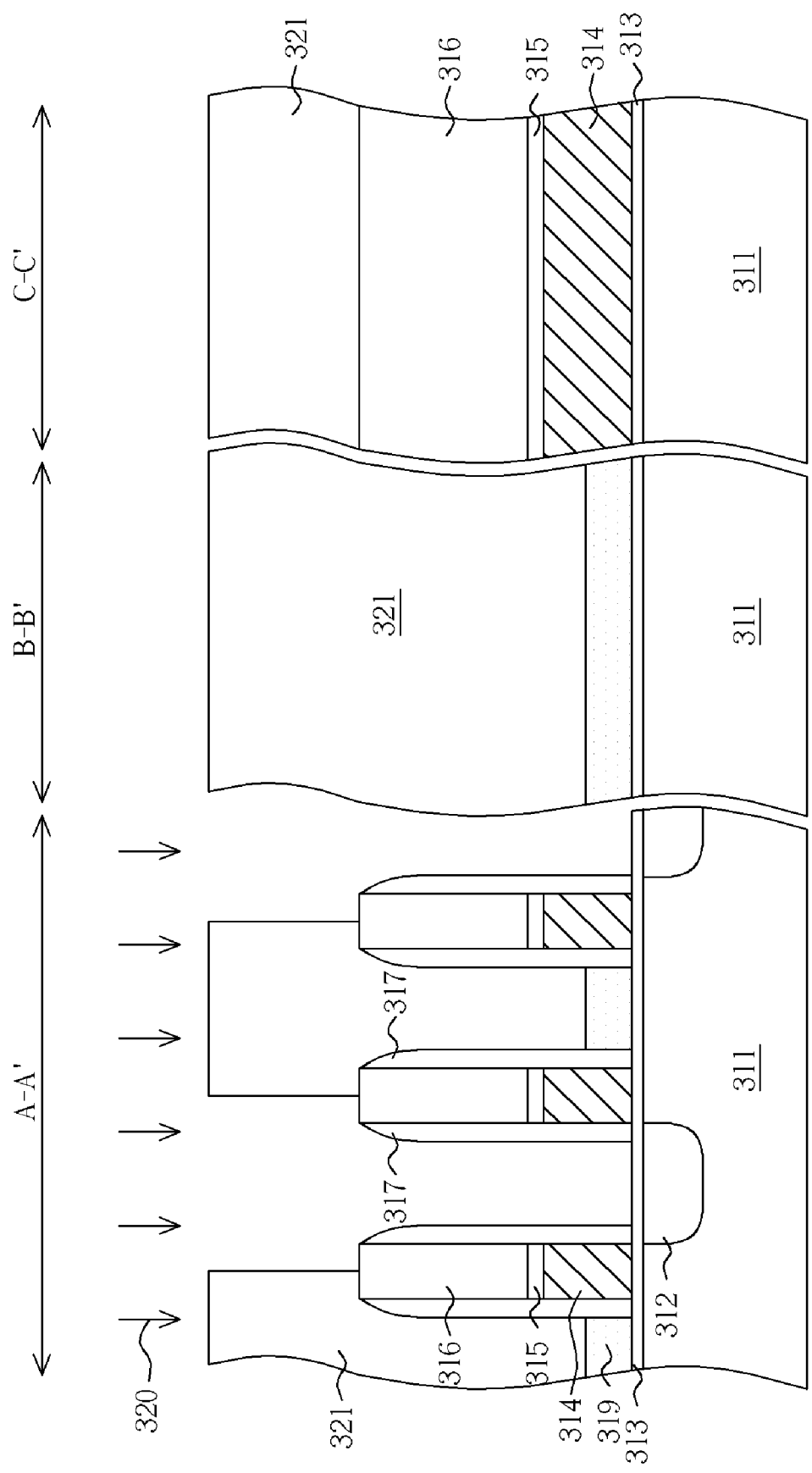

As shown in FIG. 11, a photo resist layer 321 is patterned for performing an etching process to remove the conductive lines 319 between two conductive lines. As a result, a conductive line 319 is retained on the semiconductor substrate between another two conductive lines. The conductive line 319 will serve as a select gate of the memory structure. Subsequently, an ion implantation 320, generally a N+ implantation, and an annealing process are performed on the P-well 311 of the semiconductor substrate to form doping regions 312, such as buried diffusion regions or bit lines, in the semiconductor substrate. Subsequently, the photo resist layer 321 is stripped away. As a result, there are two conductive lines 314 and one conductive line 319 formed on the semiconductor substrate between two doping regions 312.

Figure 12:
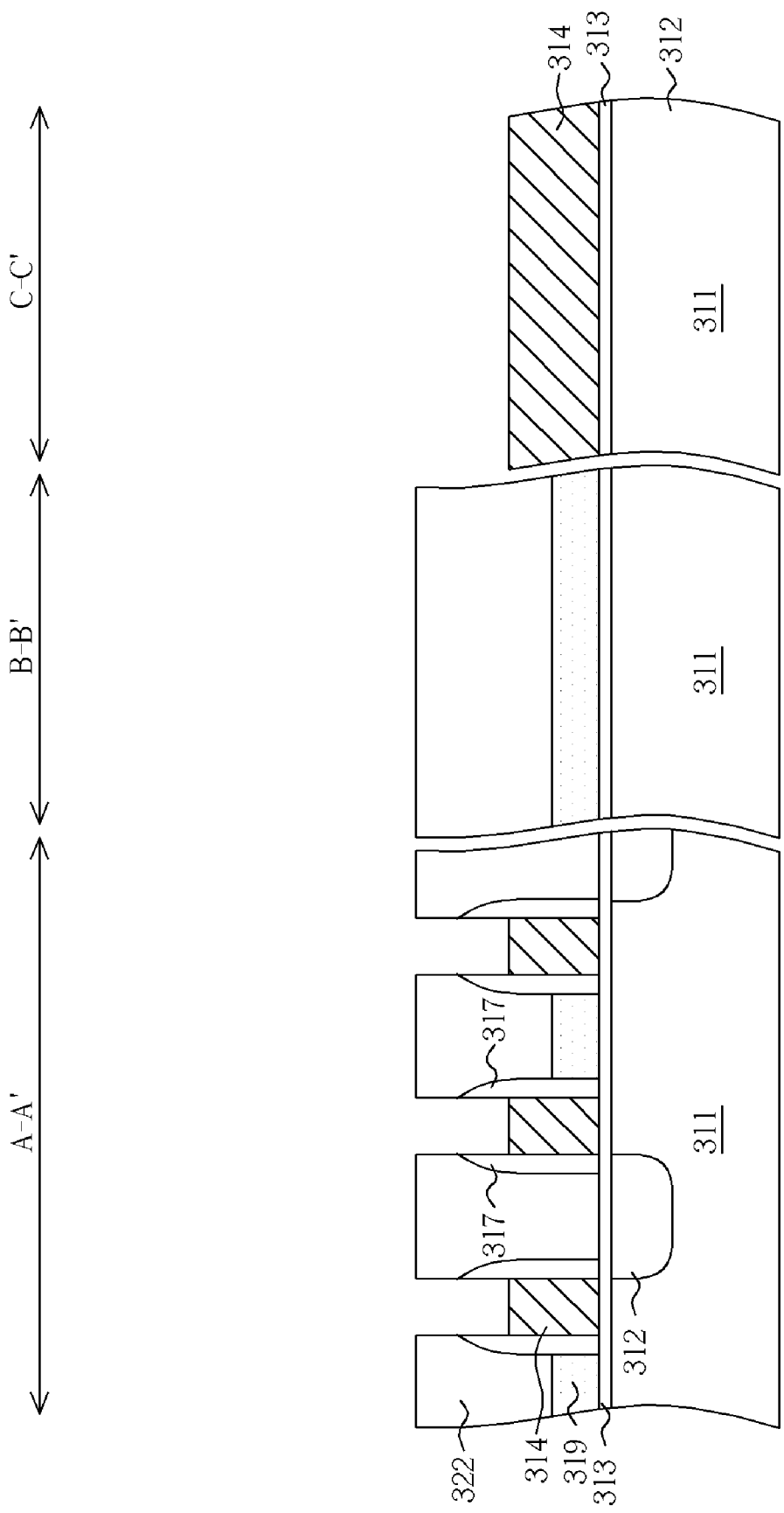

As shown in FIG. 12, a dielectric layer 322 is deposited on the semiconductor substrate and chemically mechanically polished back using the top of the cap layer of SiN 316 as a stop layer. Thereafter, the cap layer of TEOS 315 and the cap layer of SiN 316 of the conductive lines are removed using a wet etching process.

Figure 13:
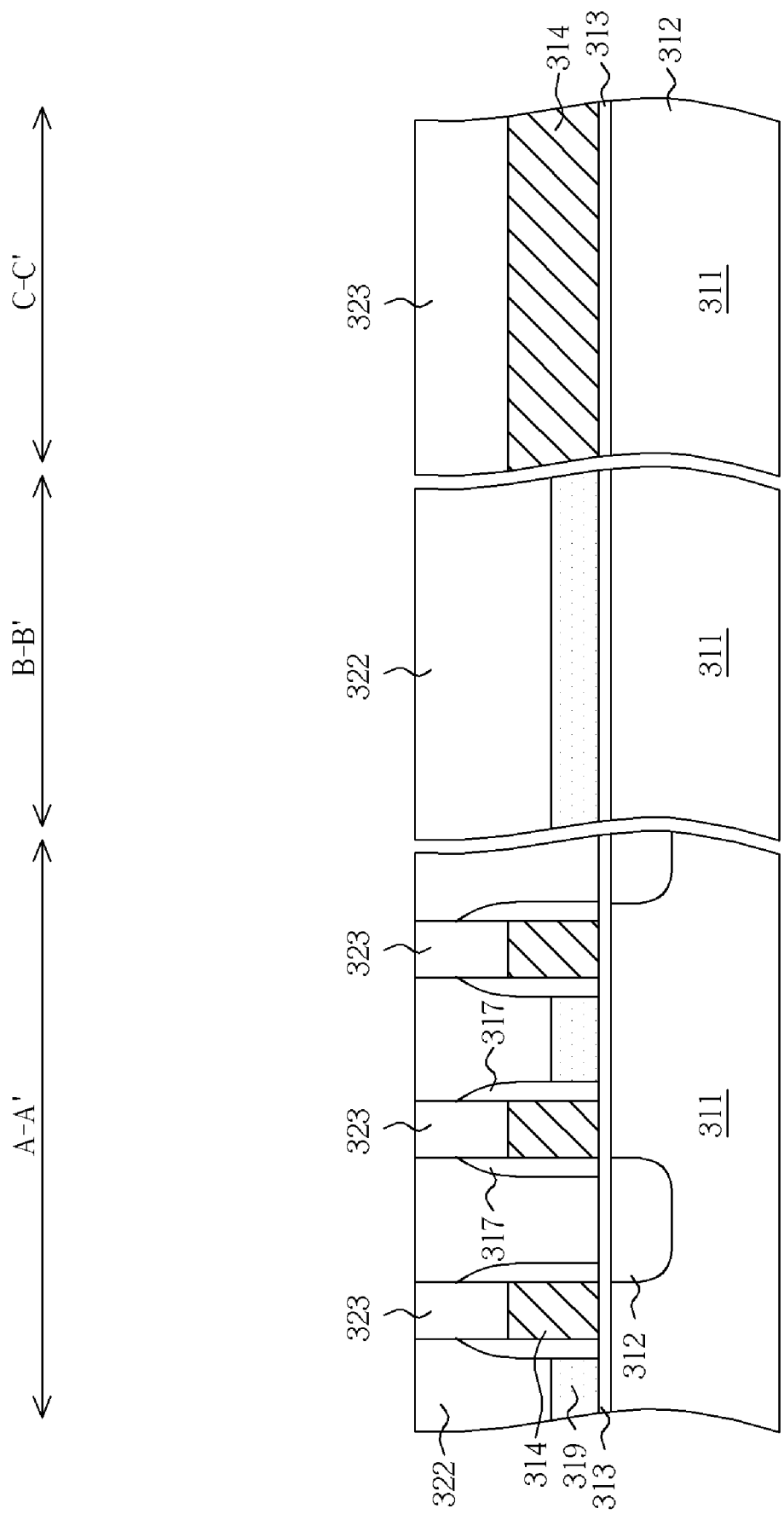

As shown in FIG. 13, a conductive material is deposited on the semiconductor substrate, filling the empty upper part of the conductive lines, and etched back using the dielectric layer 322 as a stop layer. The conductive material forms a conductive layer 323 as the upper part of the conductive blocks. As a result, the conductive lines as floating gates comprise two integrated conductive layers.

Figure 14:
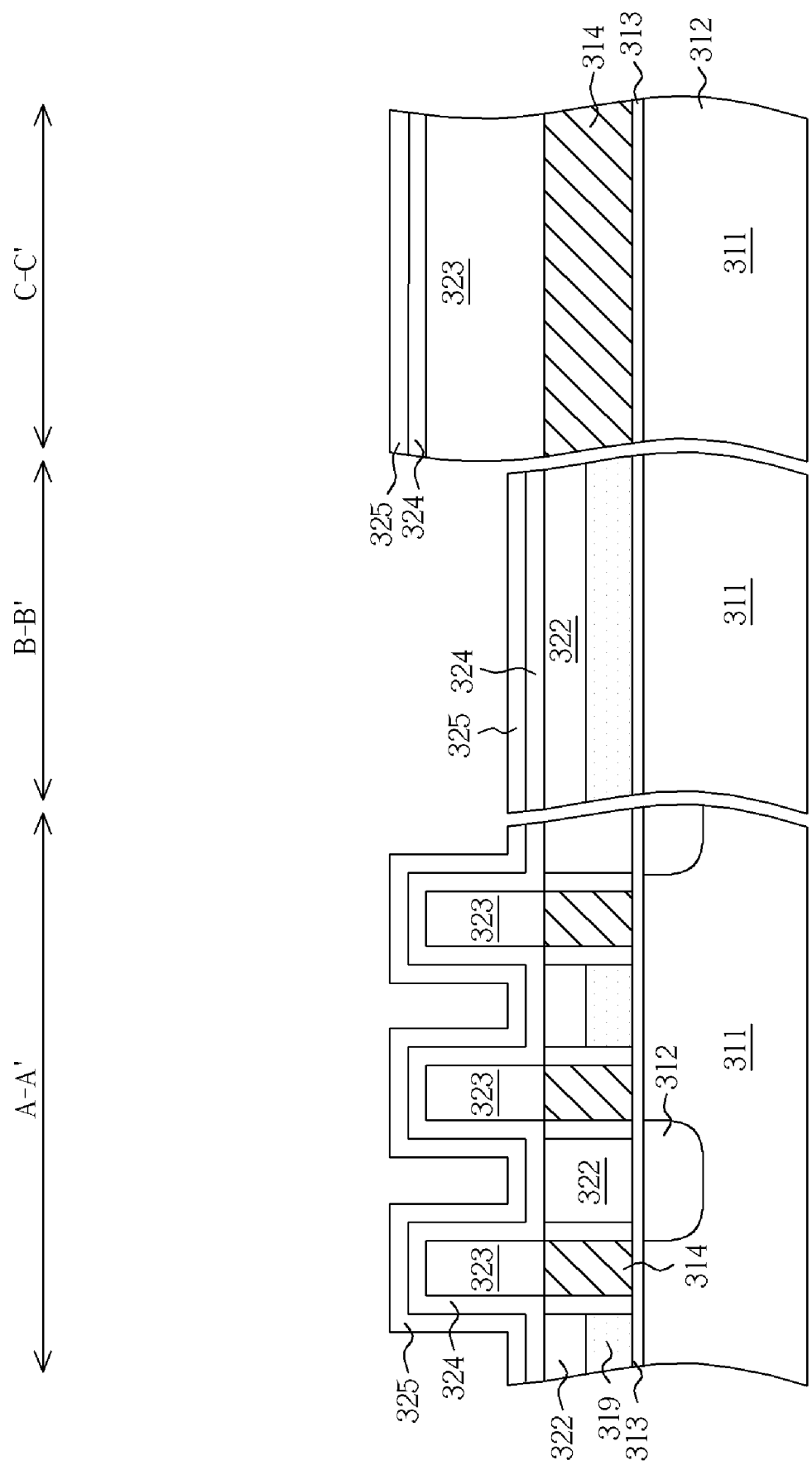

As shown in FIG. 14, the dielectric layer 322 is etched back to expose a part of the conductive lines, such as the top and partial sides of the conductive layer 323. A part of the dielectric layer 322 is retained on the top of the conductive lines 319 and above the doping regions. The thickness of the dielectric layer 322 on the conductive lines 319 functioning as select gates is preferably sufficient for the protection of the select gates in the later-on etching steps. Next, a dielectric layer 324, which may comprise oxide/nitride/oxide, is deposited on the exposed top and partial sides of the conductive layer 323 of the conductive blocks and the dielectric layer 322. Subsequently, a cap layer 325, which may comprise polysilicon, may be further deposited on the dielectric layer 324.

Figure 15:
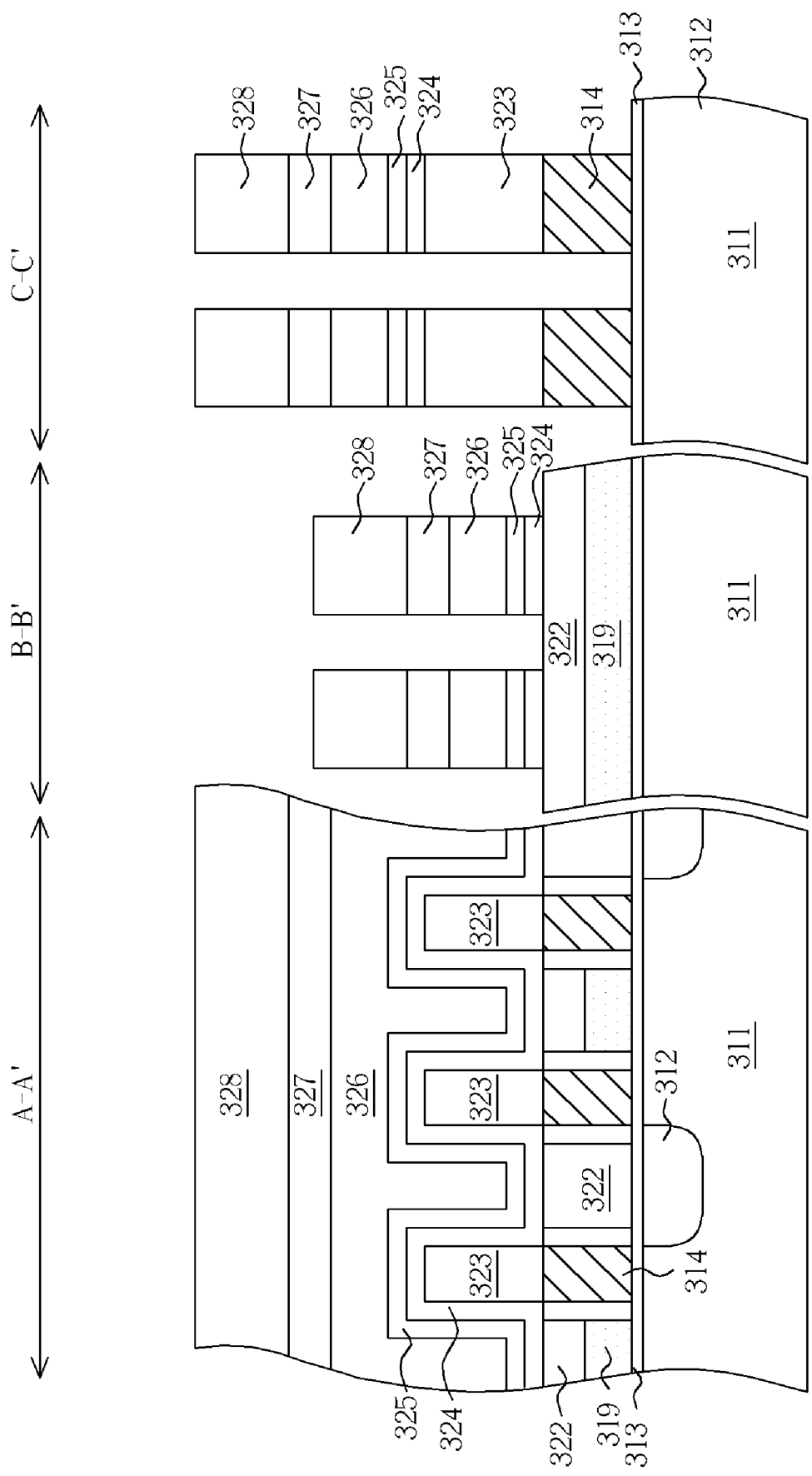

As shown in FIG. 15, finally, a conductive layer, such as a polysilicon layer 326/WSi layer 327/SiN layer 328, is deposited on the second dielectric layer 324 or the cap layer 325. Then, a SAMOS (self-aligned) etching process is performed to etch the SiN layer 328, the WSi layer 327, the polysilicon layer 326, the dielectric layer 324 (e.g. ONO), and the conductive layer 314, and stop at an oxide layer, to pattern a plurality of lines, such as word lines, perpendicular to the diffuse lines (doping regions 312). Simultaneously, the conductive lines defined from the conductive layer 314 are further defined as a plurality of conductive blocks for the function as floating gates. The etching selectivity for oxide should be good at end point, and the oxide (such as the dielectric layer 322 on the conductive line 319) between the control gate (word line) and the select gate is preferably thick enough to prevent the select gate from etching away during SAMOS etching process. After the SAMOS etching process, the SiN layer 328 is removed. After the removing processes, a gate re-oxidation may be performed to recovery some loss of oxide material.

It is noted that, in the first embodiment, the float gate is a stacked float gate and is first to be made in the manufacturing process.

A process for making a memory cell of the NMOS type in a second embodiment is exemplified as follows. The whole floating gate is first to be made. FIGS. 16-20 show the cross-sectional diagrams of lines AA', BB', and CC' as shown in FIG. 5, respectively, during the manufacturing process for the memory structure.

Figure 16:
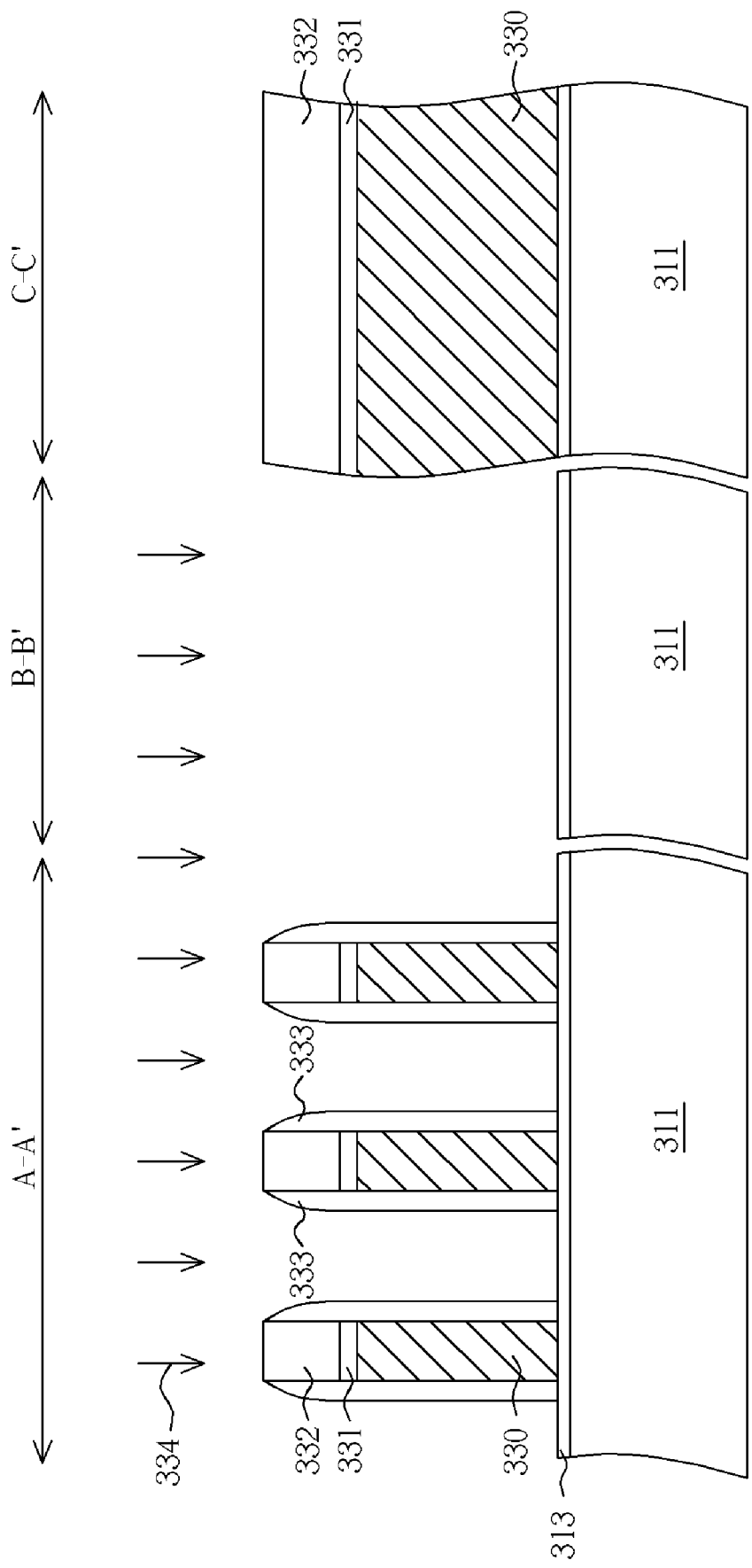
FIGS. 16 through 20 illustrate the processes of manufacturing the memory structure in another embodiment according to the present invention.

FIG. 16 shows a plurality of conductive lines comprising a conductive layer 330, a cap layer of TEOS 315 and a cap layer of SiN 316 as a mask layer on the semiconductor substrate similarly to the plurality of conductive lines shown in FIG. 9, except that the conductive layer 330 is much thicker than the conductive layer 314, such that the conductive blocks shown in FIG. 16 has a high aspect ratio. There are spacers 333 at the sides of the conductive lines. An ion implanting step 334 is performed to give the memory structure a threshold voltage. Next, a conductive layer 336 on the semiconductor substrate between every two conductive lines and the doping regions 312 are formed similarly to FIGS. 10 and 11.

Figure 17:
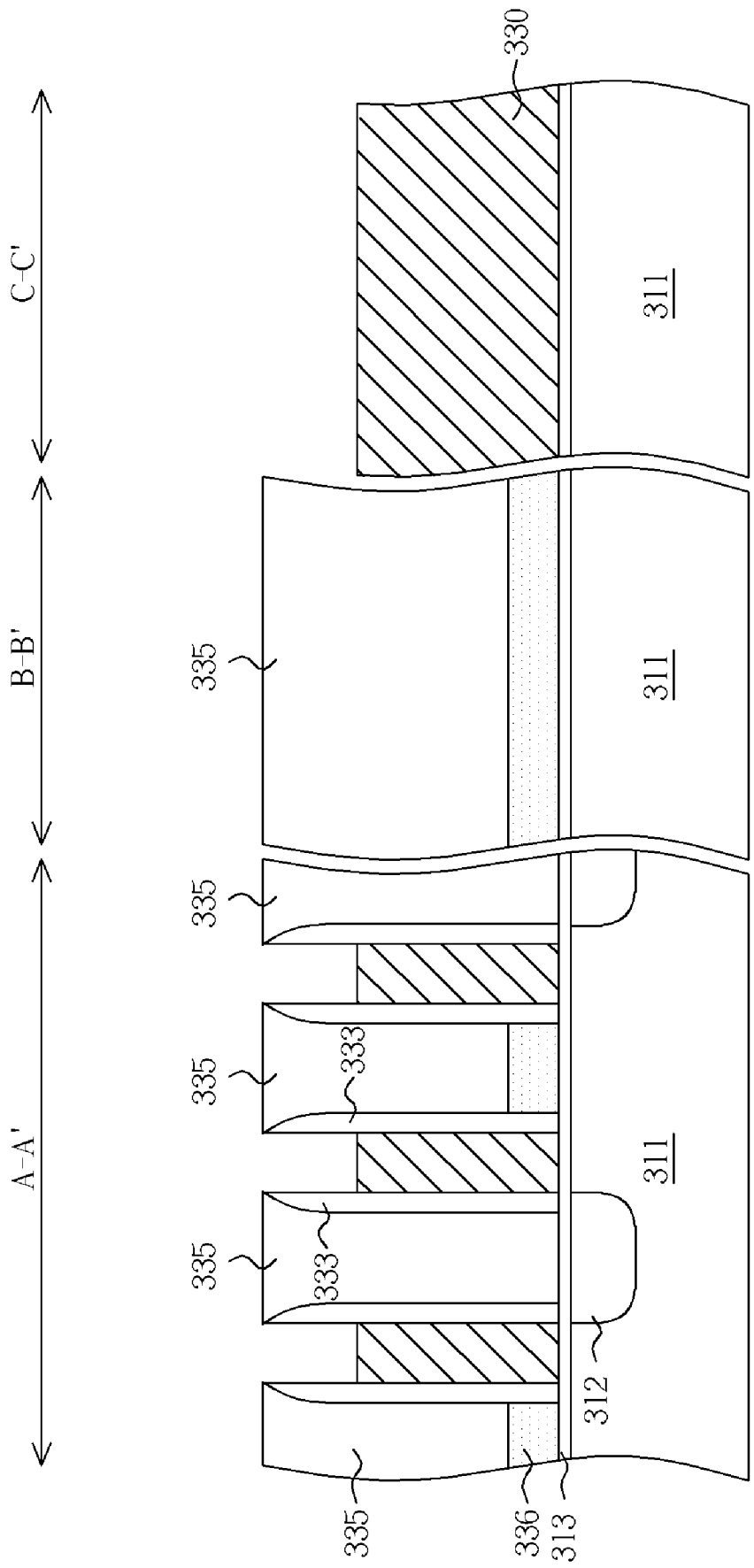
Figure 18:
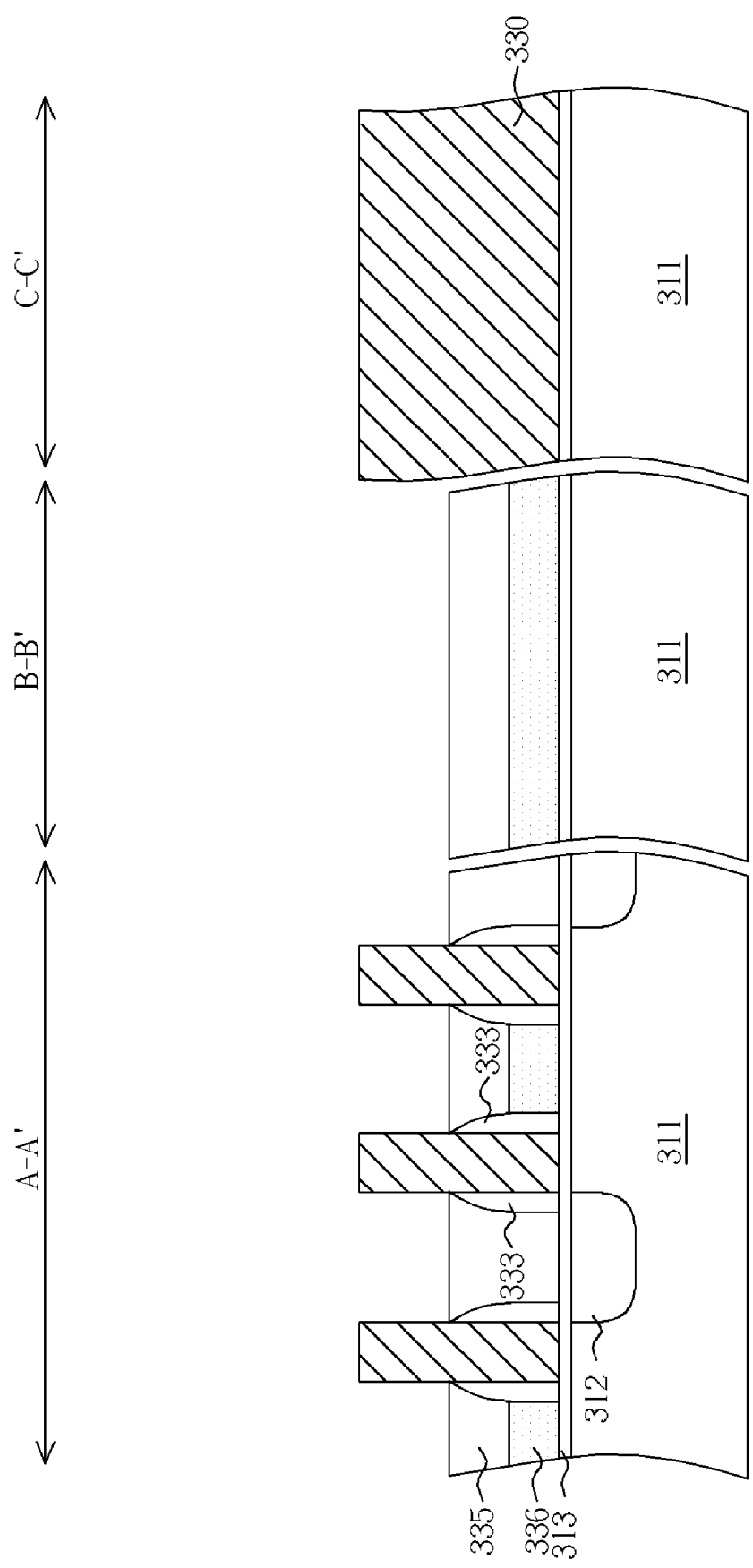

As shown in FIG. 17, a dielectric layer 335 is deposited on the semiconductor substrate and chemically mechanically polished back using the top of the cap layer of SiN 332 as a stop layer. Thereafter, the cap layer of TEOS 331 and the cap layer of SiN 332 of the conductive lines are removed using a wet etching process. As shown in FIG. 18, the dielectric layer 335 and a part of spacer 333 are etched back to expose a part of the conductive lines, such as the top and partial sides of the conductive layer 330. A part of the dielectric layer 335 is retained on the top of the conductive layer 336 and above the doping regions 312.

Figure 19:
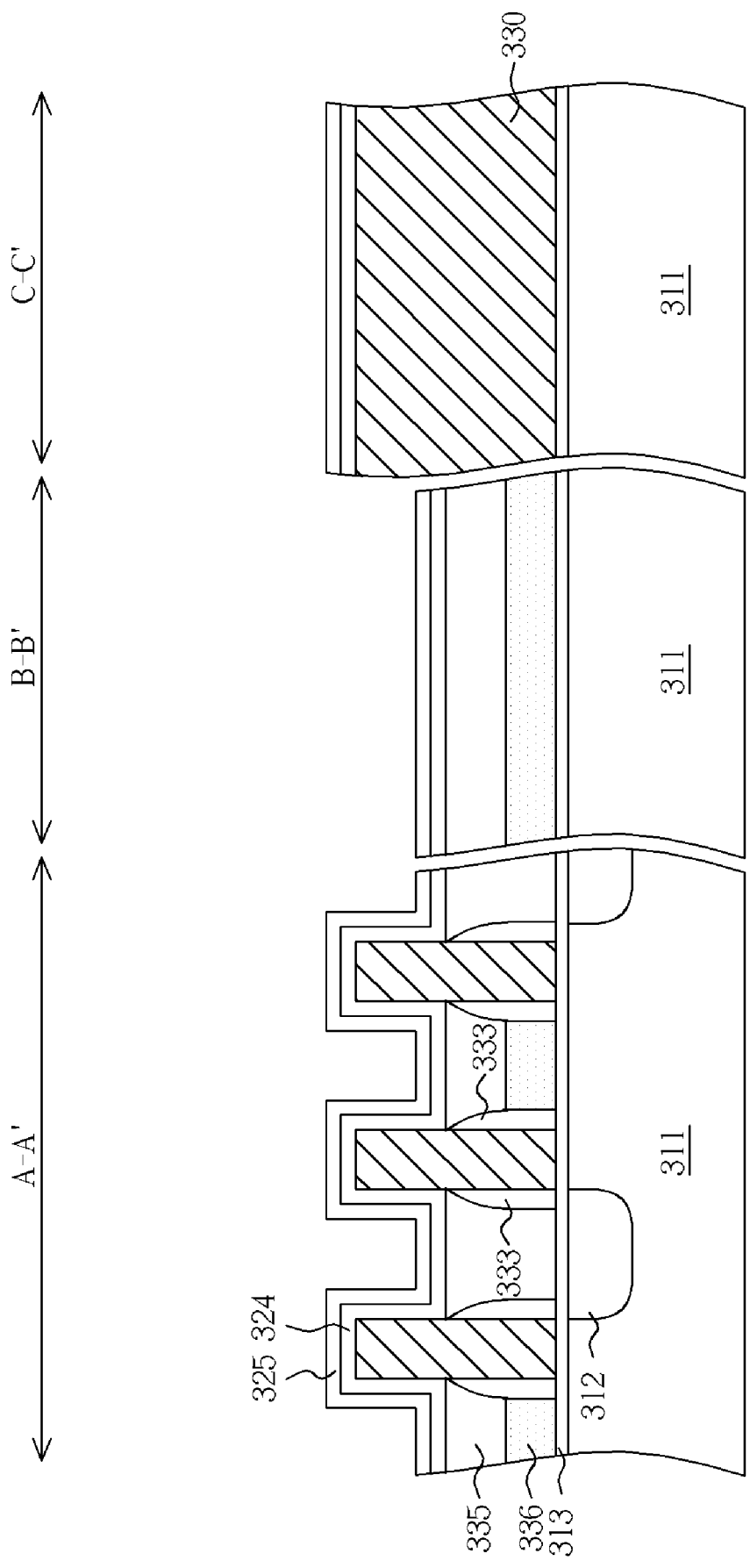
Figure 20:
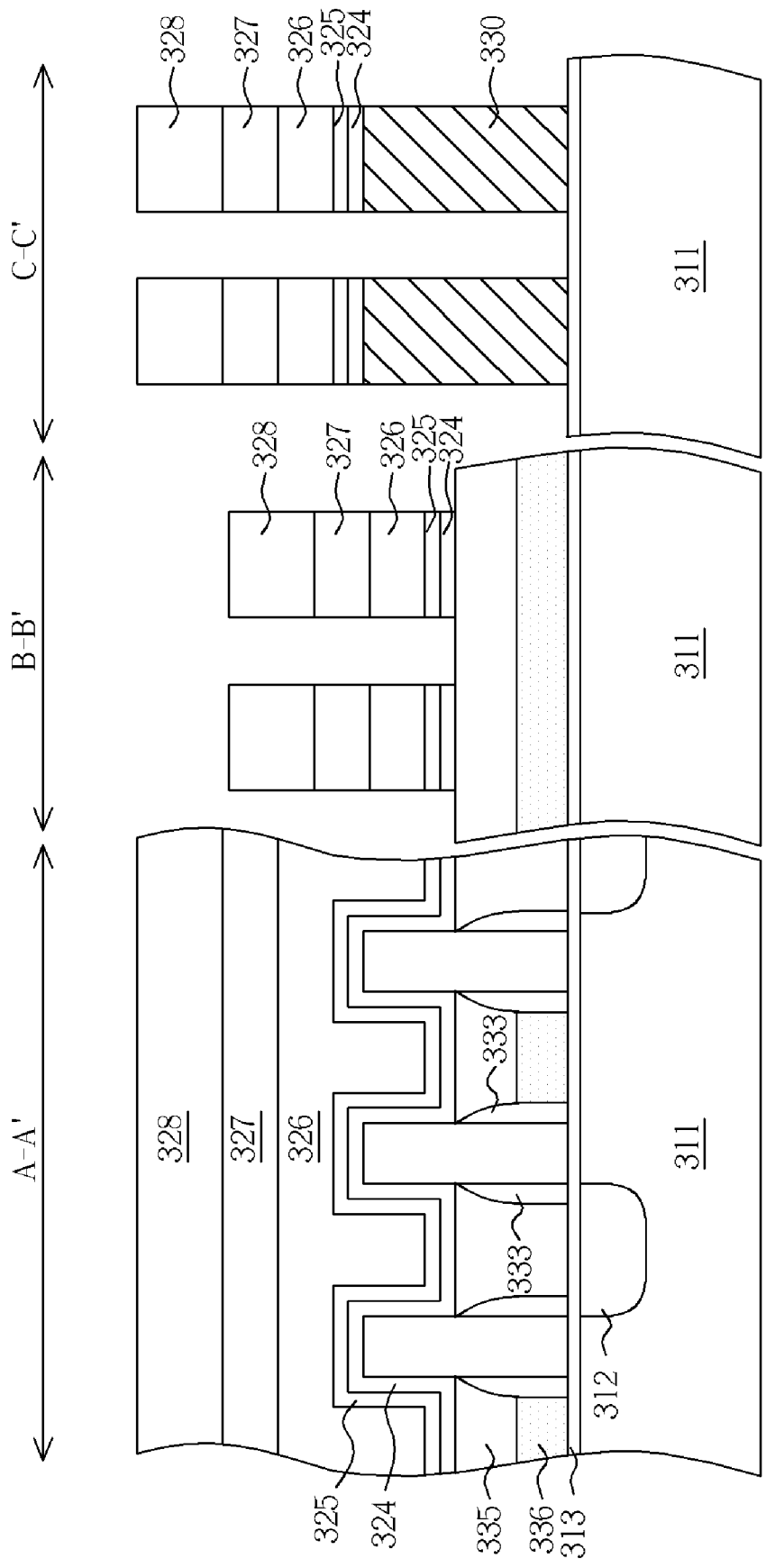

As shown in FIG. 19, a dielectric layer 324, which may comprise oxide/nitride/oxide, is deposited on the exposed top and partial sides of the conductive layer 330 of the conductive lines and the dielectric layer 335. Subsequently, a cap layer 325, which may comprise polysilicon, may be further deposited on the dielectric layer 324. As shown in FIG. 20, finally, a conductive layer, such as a polysilicon layer 326/WSi layer 327/SiN layer 328, is deposited on the dielectric layer 324 or the cap layer 325 and the SAMOS etching process is performed to pattern plurality of lines, such as word lines, perpendicular to the diffuse lines (doping regions 312). Simultaneously, the conductive lines defined from the conductive layer 330 are further defined as a plurality of conductive blocks for the function as floating gates. After the SAMOS etching process, the SiN layer 328 is removed.

It is noted that, in the second embodiment, the float gate is a single bulk of float gate and is first to be made in the manufacturing process.

A process for making a memory cell of the NMOS type in a third embodiment is exemplified as follows. The select gate is first to be made. FIGS. 21-27 show the cross-sectional diagrams of lines AA', BB', and CC' as shown in FIG. 5, respectively, during the manufacturing process for the memory structure.

Figure 21:
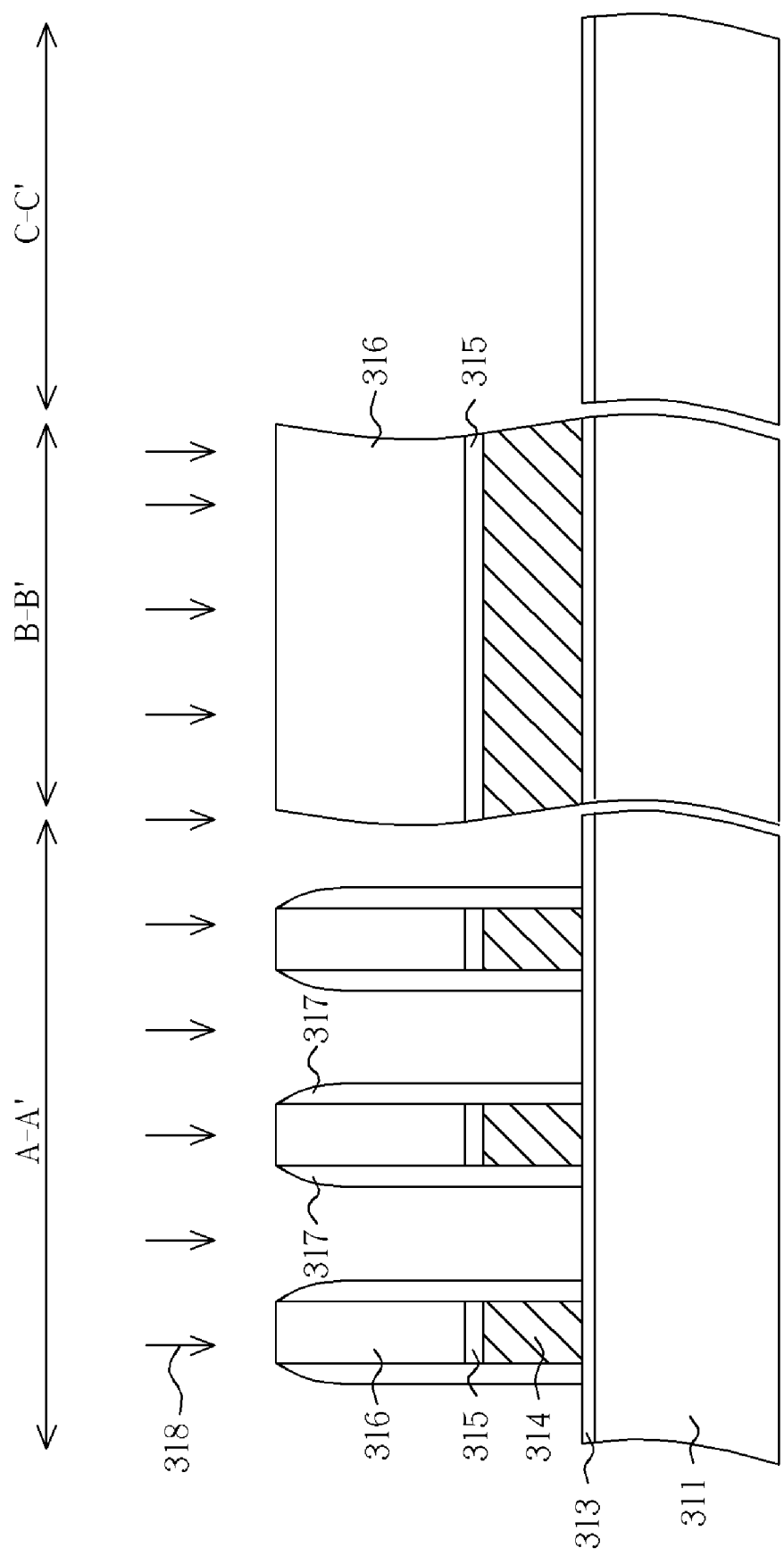
FIGS. 21 through 27 illustrate the processes of manufacturing the memory structure in still another embodiment according to the present invention.

FIG. 21 shows, after a gate dielectric layer 313, a conductive layer 314, and a cap layer of TEOS 315 and a cap layer of SiN 316 as a mask layer are sequentially deposited on the semiconductor substrate, a plurality of conductive lines comprising a conductive layer 314, a cap layer of TEOS 315 and a cap layer of SiN 316 as a mask layer are patterned. The conductive lines will serve as select gates after the memory structure is formed. There are spacers 317 at the sides of the conductive lines. An ion implanting step 318 is performed to give the memory structure a threshold voltage.

Figure 22:
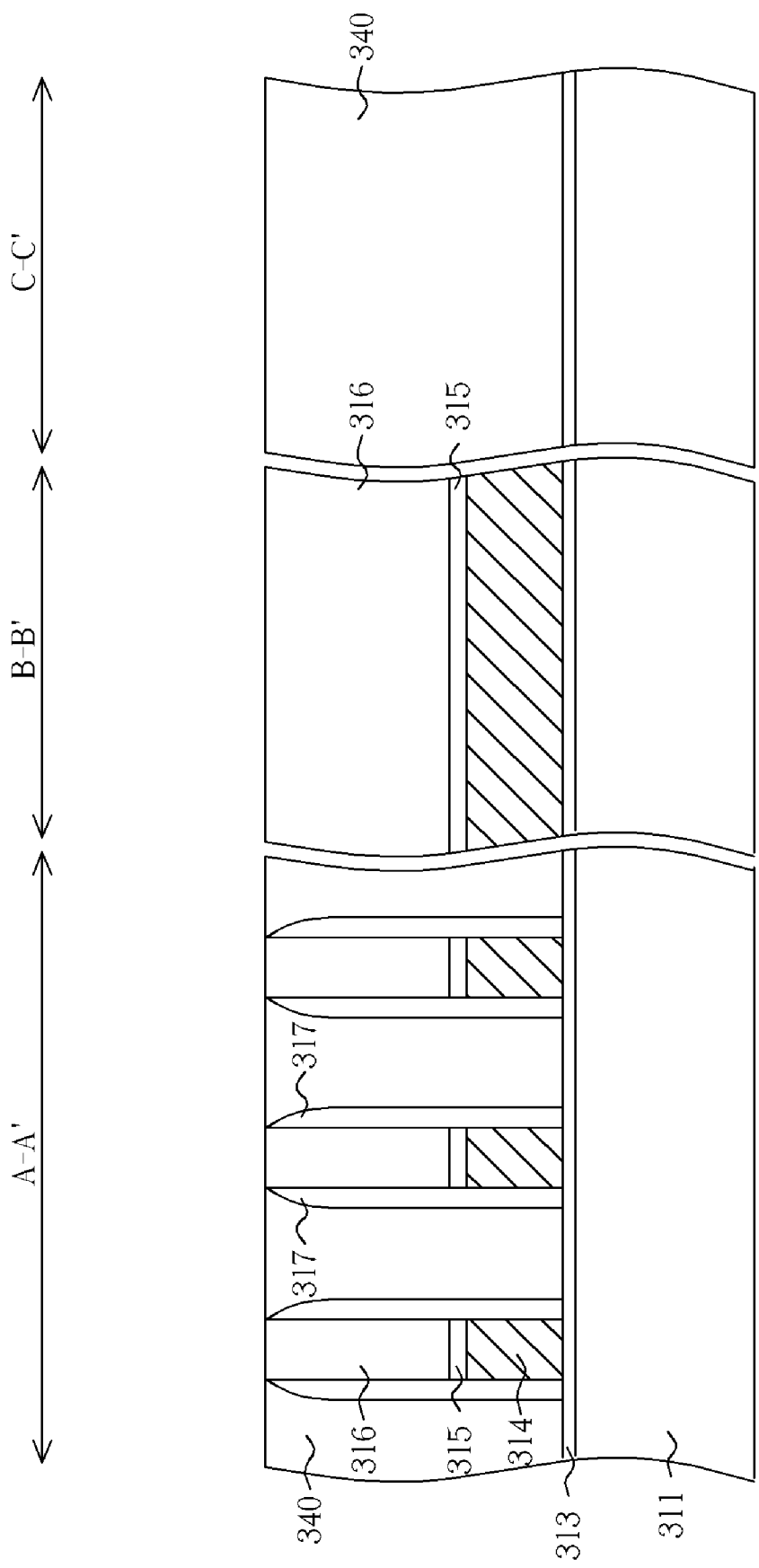

As shown in FIG. 22, a dielectric layer as a gate oxide layer may be further formed on the exposed semiconductor substrate for insulation of the select gate formed later on and the semiconductor substrate. Next, a conductive layer is deposited on the semiconductor substrate and the conductive lines, and chemically mechanically polished back using the top of the conductive lines as a stop layer. Thus, a conductive line 340 is formed to fill between the conductive lines consisting of a conductive layer 314, a cap layer 315, and a cap layer 316.

Figure 23:
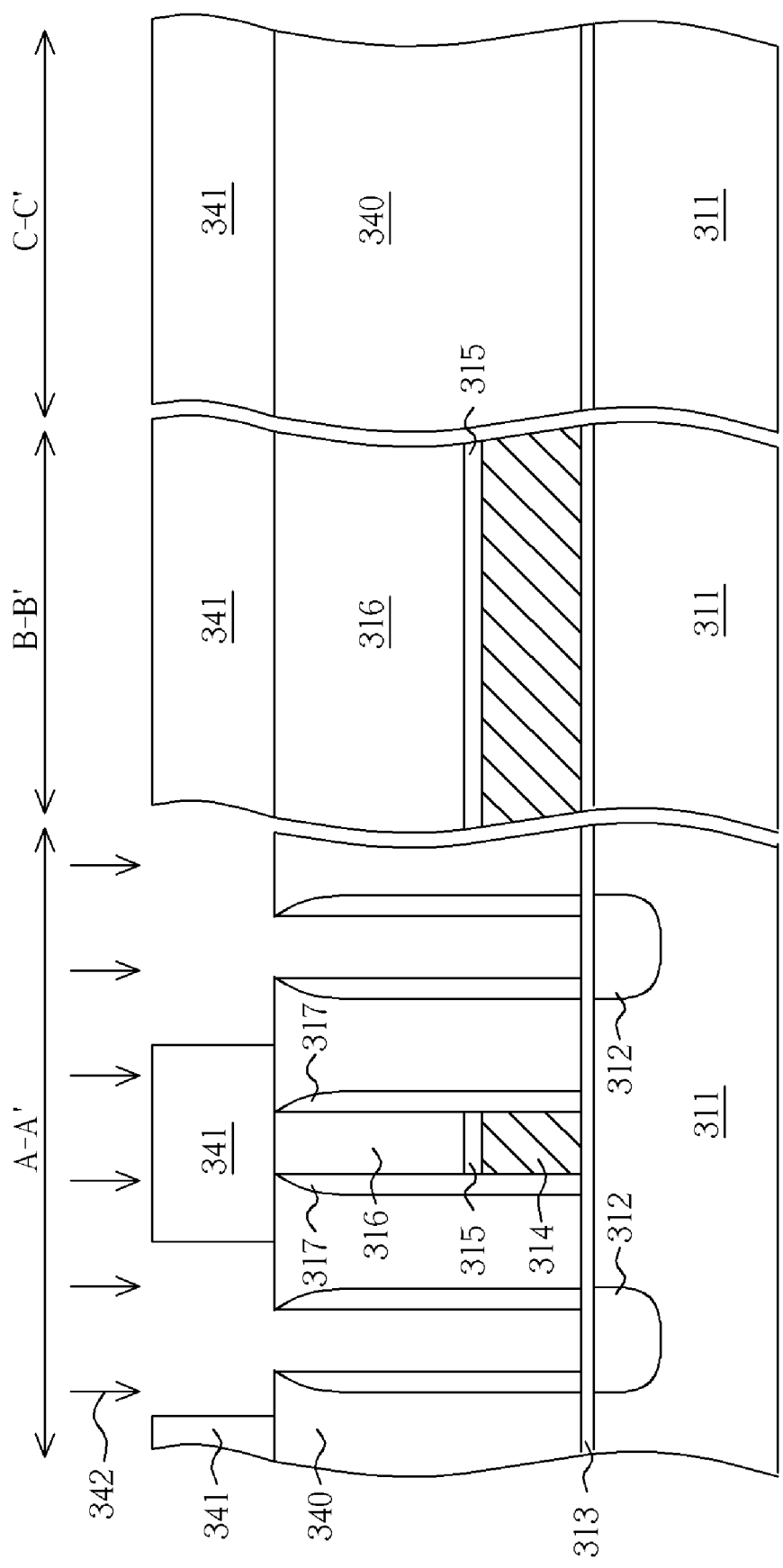

As shown in FIG. 23, a photo resist layer 341 is patterned to cover one of every two conductive lines consisting of a conductive layer 314, a cap layer 315, and a cap layer 316 and part of the adjacent conductive lines 340 for performing an etching process to remove the uncovered conductive lines. As a result, another one of the every two conductive lines is retained on the semiconductor substrate between every two conductive lines 340. Subsequently, an ion implantation 342, generally a N+ implantation, and an annealing are performed on the P-well 311 of the semiconductor substrate to form doping regions 312, such as buried diffusion regions or bit lines, in the semiconductor substrate. Subsequently, the photo resist layer 341 is stripped away. As a result, there are two lines of the conductive lines 340 and one conductive line 314 formed on the semiconductor substrate between two doping regions 312.

Figure 24:
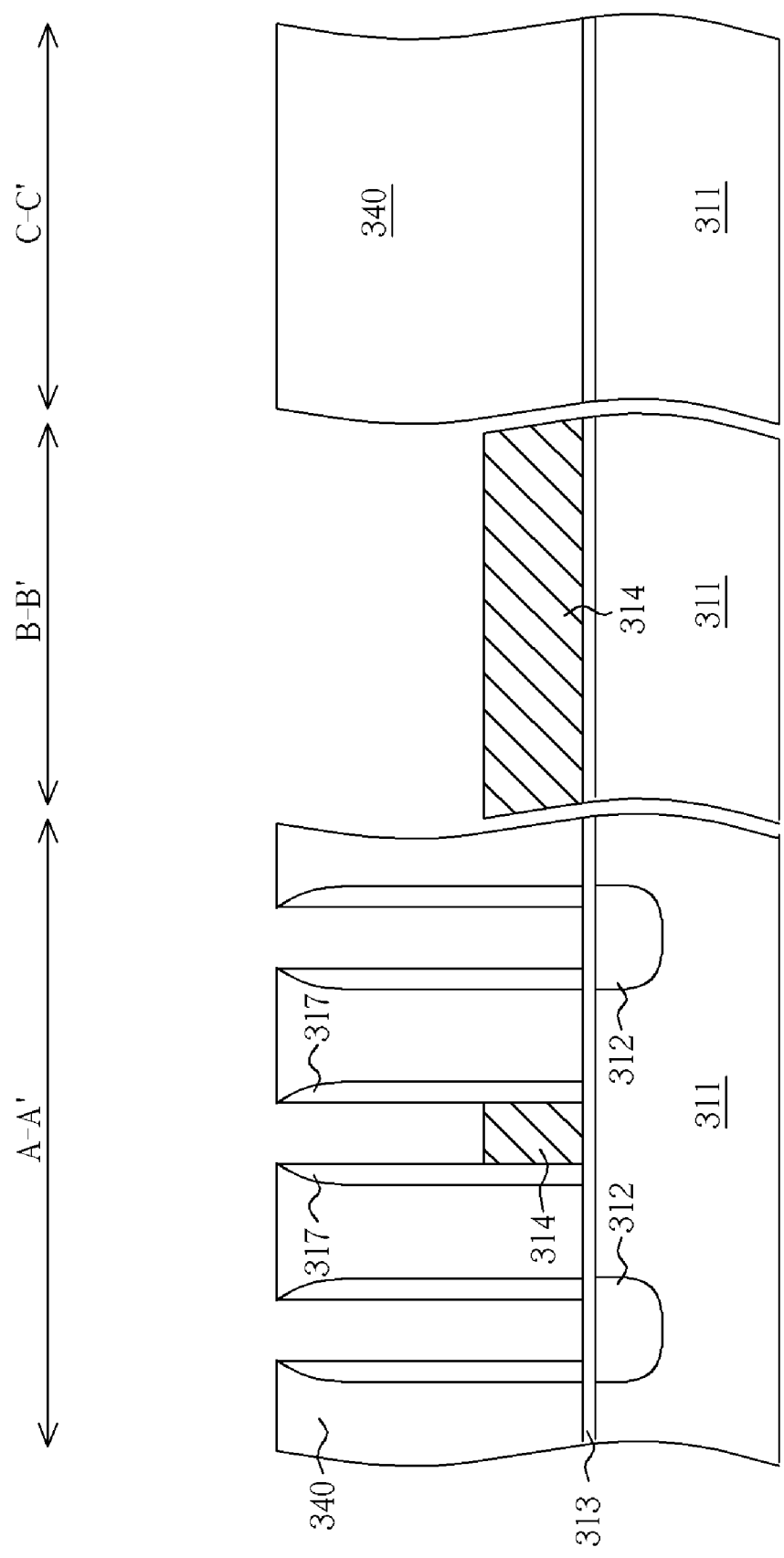
Figure 25:
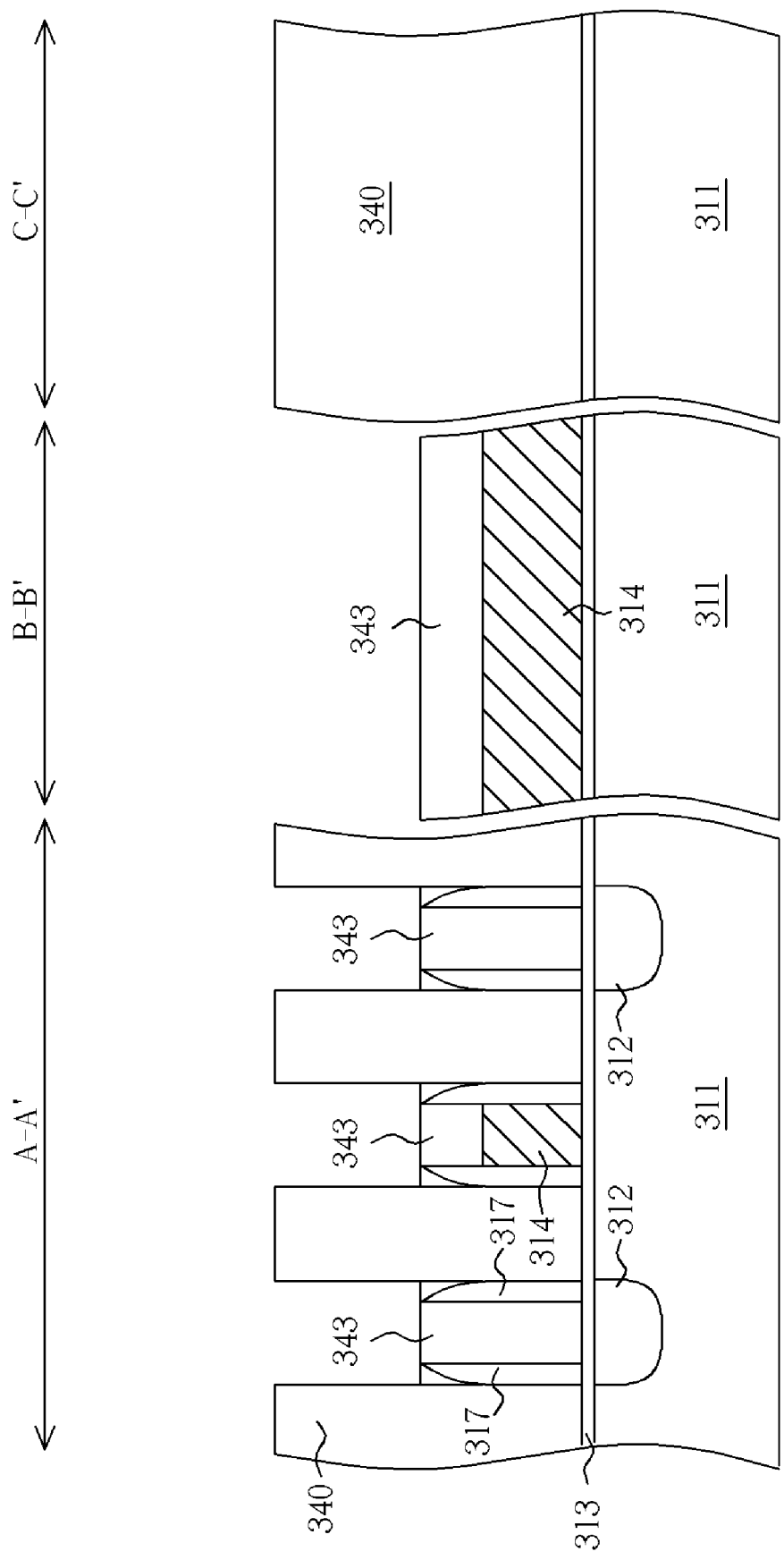

As shown in FIG. 24, the cap layer of TEOS 315 and the cap layer of SiN 316 of the conductive lines are removed using a wet etching process. Next, as shown in FIG. 25, a dielectric layer 343 is deposited over the conductive lines and the gate oxide layer on the substrate. Subsequently, the dielectric layer 343 is etched back and a portion of the spacers are also etched to expose a top and partial side surface of the conductive lines 340. A part of the dielectric layer 343 is retained on the top of the conductive layer 314 and above the doping regions 312.

Figure 26:
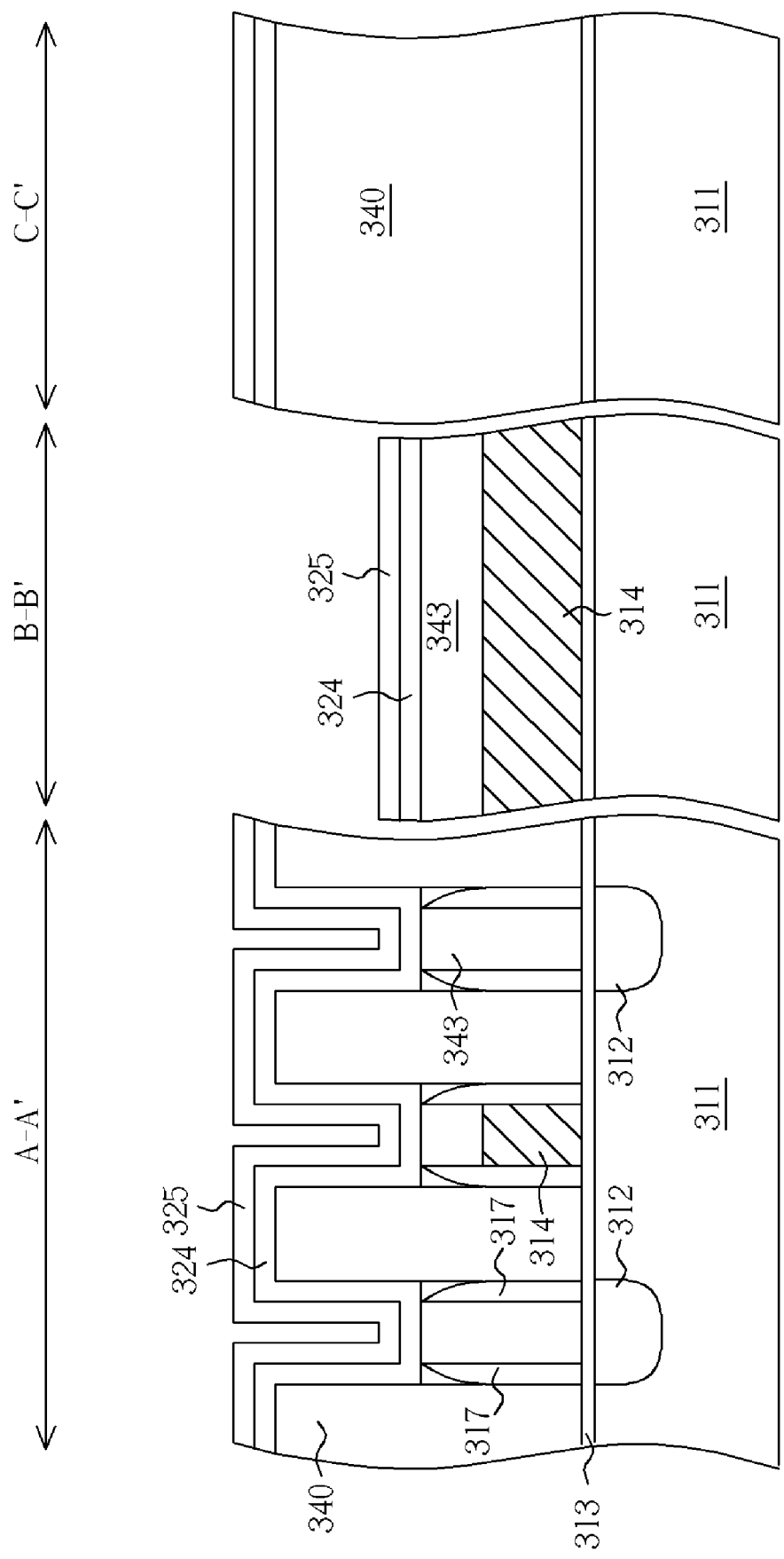
Figure 27:
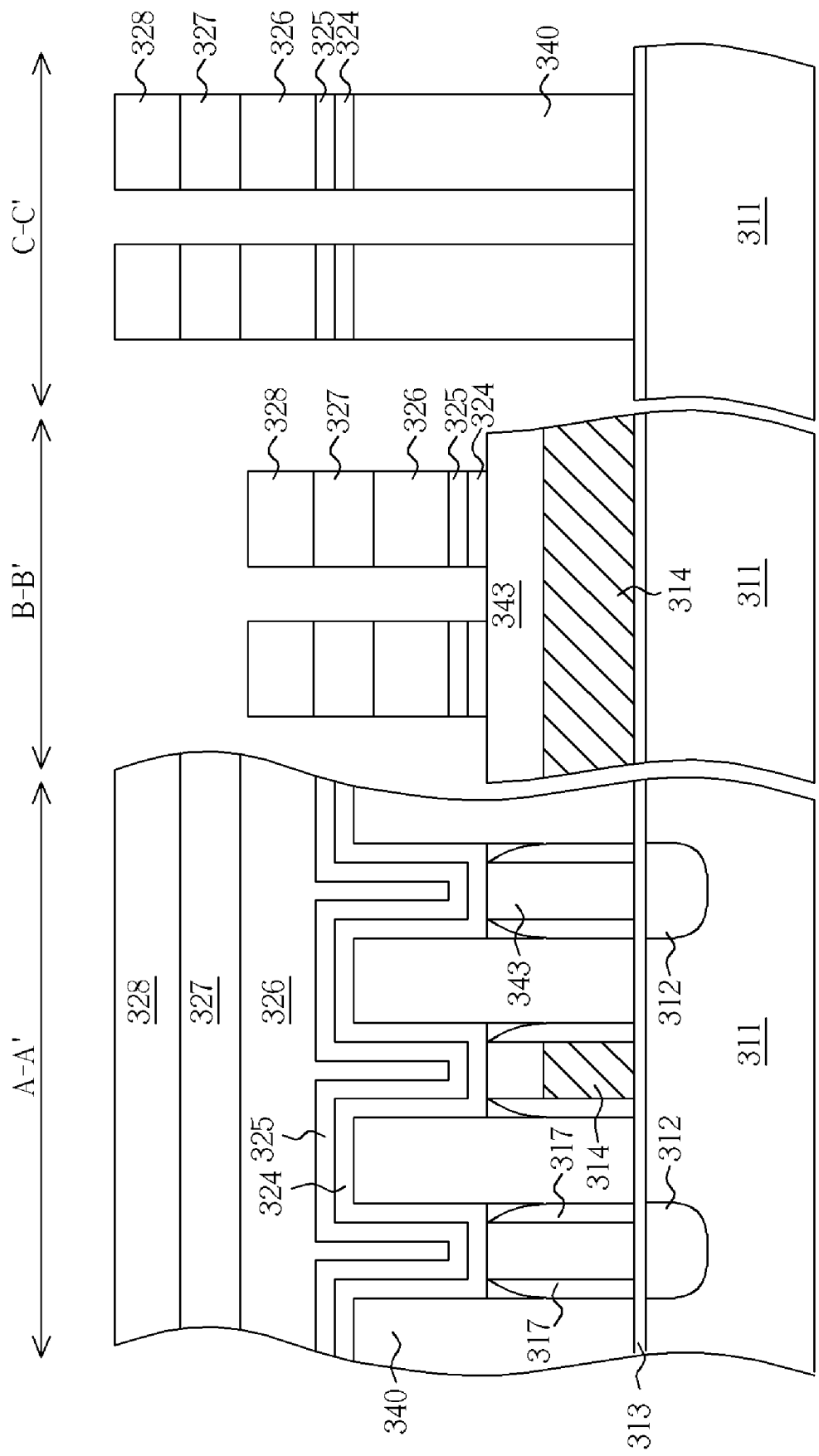

Subsequently, as shown in FIG. 26, a dielectric layer 324, which may comprise oxide/nitride/oxide, is deposited on the exposed top and partial sides of the conductive lines 340 and the dielectric layer 343. Subsequently, a cap layer 325, which may comprise polysilicon, may be further deposited on the dielectric layer 324. Finally, as shown in FIG. 27, a conductive layer, such as a polysilicon layer 326/WSi layer 327/SiN layer 328, is deposited on the dielectric layer 324 or the cap layer 325 and a SAMOS etching process is performed to pattern a plurality of lines, such as word lines, perpendicular to the diffuse lines (doping regions 312). Simultaneously, the conductive lines 340 are further defined as a plurality of conductive blocks for the function as floating gates. After the SAMOS etching process, the SiN layer 328 is removed.

It is noted that, in the third embodiment, the select gate is the first to be made in the manufacturing process.

According to the present invention, the floating gate has a raised height related to the select gates to get an increased ONO area effectively, thus the gate coupling ratio is improved. For example, ONO area which is 3 times larger than conventional one may guarantee the erase efficiency. Furthermore, there is a wide and thick dielectric layer (such as the dielectric layers 322, 335, and 343) between two memory structures, such that neighbor capacitance is small and can be ignored.

Figure 28:
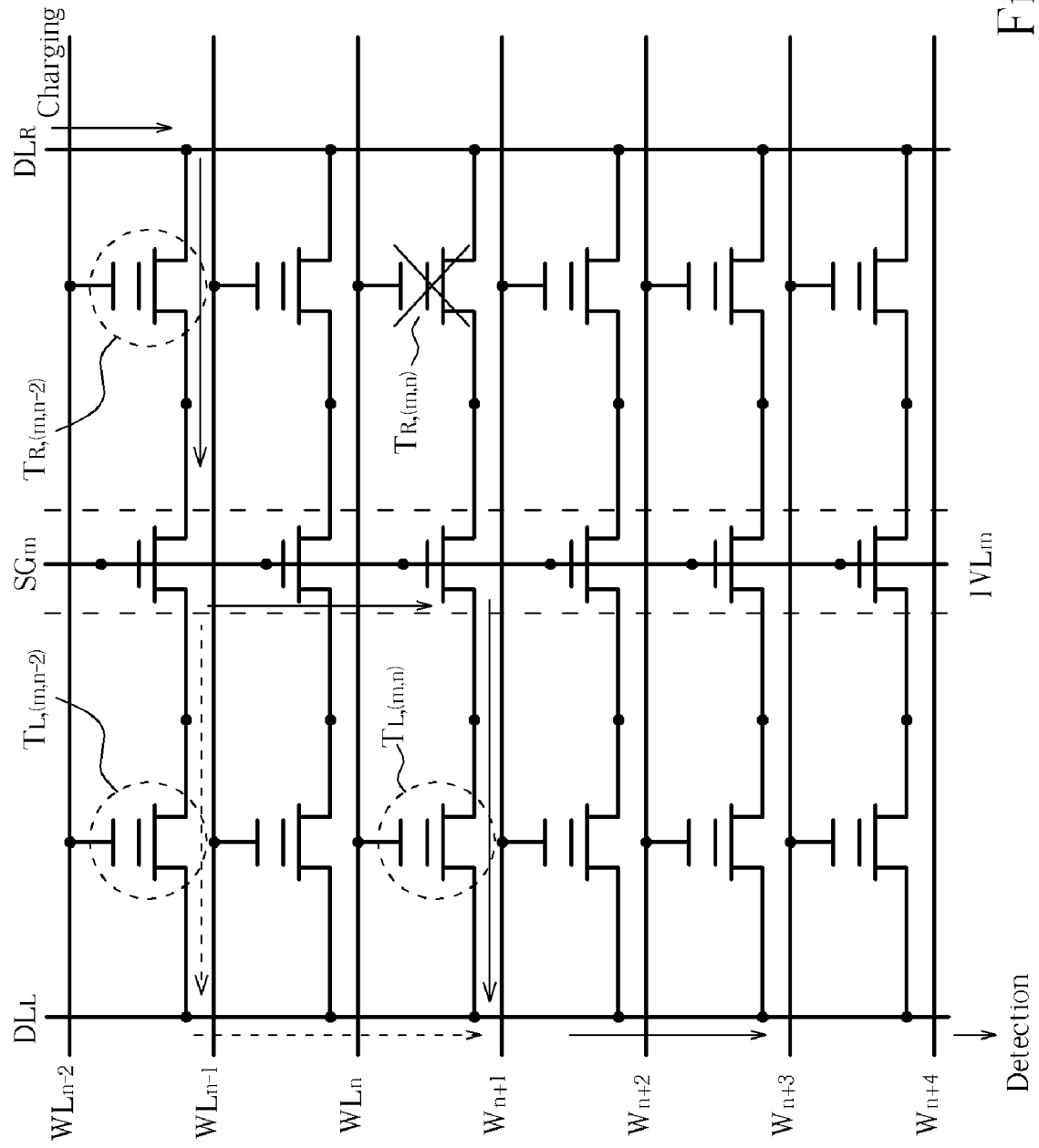
FIG. 28 is a diagram illustrating a first embodiment of the method for reading the memory array of the present invention.

Read Method:

Please refer to FIG. 28. FIG. 28 is a diagram illustrating a first embodiment of the method for reading the memory array of the present invention. The select gates $SG_m$ represent the $m^{th}$ column of select gates of the memory array of the present invention. The data lines $DL_L$ and $DL_R$ respectively represent the data lines to the left and right of the select gates $SG_m$. The floating gate $T_{R,(m,n-2)}$ represents the floating gate at the right side of the $m^{th}$ column and the $(n-2)^{th}$ row of the memory array, the floating gate $T_{L,(m,n)}$ represents the floating gate at the left side of the $m^{th}$ column and the $n^{th}$ row of the memory array, and so on. The word line $WL_{n-2}$ represents the $(n-2)^{th}$ word line of the memory array, the word line $WL_{n-1}$ represents the $(n-1)^{th}$ word line of the memory array and so on.

Please continue referring to FIG. 28. Before reading, some of the floating gates of the $m^{th}$ column of the memory array of the present invention have to be preprogrammed so as to form a passageway for reading. For example, in FIG. 28, the floating gates $T_{L,(m,n)}$ and $T_{R,(m,n)}$ are preprogrammed. The threshold of the floating gate $T_{L,(m,n)}$ is preprogrammed to be a low voltage so that the floating gate $T_{L,(m,n)}$ is turned on after the word line $WL_n$ is charged. The threshold of the floating gate $T_{R,(m,n)}$ is preprogrammed to be a high voltage so that the floating gate $T_{L,(m,n)}$ remains off even after the word line $WL_n$ is charged. For example, when the threshold of the floating gate $T_{R,(m,n)}$ is preprogrammed to 6V, the threshold of the floating gate $T_{L,(m,n)}$ is preprogrammed to 2V, and the voltage the word line $WL_n$ is charged to 4V, the floating gate $T_{L,(m,n)}$ is turned on and the floating gate $T_{R,(m,n)}$ remains off.

If the floating gate $T_{R,(m,n-2)}$ is selected to be read, the select gates $SG_m$ are turned on, the word lines $WL_{n-2}$ and $WL_n$ are charged, the data line $DL_R$ is charged, and the reading is accomplished by comparing a current or a voltage of the data line $DL_L$ with a predetermined value. The turning-on of the select gates $SG_m$ is to charge the column of the select gates $SG_m$ to form an inversion layer $IVL_m$. The inversion layer $IVL_m$ also serves as a passageway for current passing. Because the word line $WL_n$ is charged and the floating gates $T_{L,(m,n)}$ and $T_{R,(m,n)}$ are preprogrammed, the floating gate $T_{L,(m,n)}$ is turned on for passing currents and the floating gate $T_{R,(m,n)}$ is turned off to avoid current passing. If the voltage of the word line $WL_{n-2}$ is higher than the programmed threshold voltage of the floating gate $T_{R,(m,n-2)}$, the floating gate $T_{R,(m,n-2)}$ is turned on and the current from the data line $DL_R$ can pass through the floating gate $T_{R,(m,n-2)}$. Thus, the current will flow from the data line $DL_R$ to the data line $DL_L$ through the floating gate $T_{R,(m,n-2)}$, the inversion layer $IVL_m$, and the floating gate $T_{L,(m,n)}$. Meanwhile, the current can not flow through the floating gate $T_{R,(m,n)}$ to the data line $DL_R$ since the floating gate $T_{R,(m,n)}$ has been preprogrammed to be turned off.

Furthermore, if the data stored in a floating gate $T_{L,(m,n-2)}$ corresponds to a low threshold voltage, when the word line $WL_{n-2}$ is charged to a voltage higher than the threshold voltage of the floating gate $T_{L,(m,n-2)}$, the floating gate $T_{L,(m,n-2)}$ will be turned on. And if the voltage of the word line $WL_{n-2}$ also turns on the floating gate $T_{L,(m,n-2)}$, the current from the data line $DL_R$ will flow to the data line $DL_L$ through the floating gates $T_{R,(m,n-2)}$ and $T_{L,(m,n-2)}$ in addition to the flow from the data line $DL_R$ to the data line $DL_L$ through the floating gate $T_{R,(m,n-2)}$, the inversion layer $IVL_m$, and the floating gate $T_{L,(m,n)}$. This additional current passageway will effectively reduce the equivalent resistance between the data lines $DL_R$ and $DL_L$. Therefore, as the number of current passageways between the data lines $DL_R$ and $DL_L$ increases, the equivalent resistance between the data lines $DL_R$ and $DL_L$ decreases correspondingly. This will inherently improve the accuracy of reading data from the memory array because the current or voltage can be more accurately transferred from the data line $DL_R$ to the data line $DL_L$.

Please refer to FIG. 29. FIG. 29 is a diagram illustrating a second embodiment of the method for reading the memory array of the present invention. All components in FIG. 29 are the same as those in FIG. 28. In FIG. 29, another floating gate $T_{L,(m,n+3)}$ at the $m^{th}$ column and the $(n+3)^{th}$ row of the memory array is selected to be read. And the floating gates $T_{L,(m,n+1)}$ and $T_{R,(m,n+1)}$ are selected to be preprogrammed. The threshold of the floating gate $T_{R,(m,n+1)}$ is preprogrammed to be a low voltage so that the floating gate $T_{R,(m,n+1)}$ is turned on after the word line $WL_{n+1}$ is charged. The threshold of the floating gate $T_{L,(m,n+1)}$ is preprogrammed to be a high voltage so that the floating gate $T_{L,(m,n+1)}$ remains off even after the word line $WL_{n+1}$ is charged.

Please continue referring to FIG. 29. When reading the floating gate $T_{L,(m,n+3)}$, the data line $DL_L$, the word lines $WL_{n+1}$ and $WL_{n+3}$ are charged, and the voltage or current of the data line $DL_R$ is compared with a predetermined value. If the voltage or current of the data line $DL_R$ is greater than the predetermined value, then it means that the threshold voltage of the floating gate $T_{L,(m,n+3)}$ is lower than the voltage of the word line $WL_{n+3}$, and the voltage of the word line $WL_{n+3}$ can be decreased to identify the data stored in the floating gate $T_{L,(m,n+3)}$. The voltage of the word line $WL_{n+3}$ can be decreased step by step until the voltage or current of the data line $DL_R$ is smaller than the predetermined value. Then the data stored in the floating gate $T_{L,(m,n+3)}$ can be identified. Similarly, If the voltage or current of the data line $DL_R$ is smaller than the predetermined value, then it means that the threshold voltage of the floating gate $T_{L,(m,n+3)}$ is higher than the voltage of the word line $WL_{n+3}$, and the voltage of the word line $WL_{n+3}$ can be increased to identify the data stored in the floating gate $T_{L,(m,n+3)}$. The voltage of the word line $WL_{n+3}$ can be increased step by step until the voltage or current of the data line $DL_R$ is higher than the predetermined value. Then the data stored in the floating gate $T_{L,(m,n+3)}$ can be identified.

Furthermore, if the data stored in a floating gate $T_{R,(m,n+3)}$ corresponds to a low threshold voltage, when the word line $WL_{n+3}$ is charged to a voltage higher than the threshold voltage of the floating gate $T_{R,(m,n+3)}$, the floating gate $T_{R,(m,n+3)}$ will be turned on. And if the voltage of the word line $WL_{n+3}$ also turns on the floating gate $T_{R,(m,n+3)}$, the current from the data line $DL_L$ will flow to the data line $DL_R$ through the floating gates $T_{L,(m,n+3)}$ and $T_{R,(m,n+3)}$ in addition to the flow from the data line $DL_L$ to the data line $DL_R$ through the floating gate $T_{L,(m,n+3)}$, the inversion layer $IVL_m$, and the floating gate $T_{R,(m,n+1)}$. This additional current passageway will effectively reduce the equivalent resistance between the data lines $DL_L$ and $DL_R$. Therefore, as the number of current passageways between the data lines $DL_L$ and $DL_R$ increases, the equivalent resistance between the data lines $DL_L$ and $DL_R$ decreases correspondingly. This will inherently improve the accuracy of reading data from the memory array because the current or voltage can be more accurately transferred from the data line $DL_L$ to the data line $DL_R$.

Please refer to FIG. 30. FIG. 30 is a diagram illustrating a third embodiment of the method for reading the memory array of the present invention. All components in FIG. 30 are the same as those in FIG. 28. In FIG. 30, the current or voltage of the data line $DL_R$ is to be compared and the data line $DL_L$ is to be charged. And if the floating gate $T_{R,(m,n-2)}$ is turned on by the word line $WL_{n-2}$, the current of the left side data line $DL_L$ is still able to flow from the left side data line $DL_L$ through the floating gate $T_{L,(m,n)}$, the inversion layer $IVL_m$, the floating gate $T_{R,(m,n-2)}$, to the data line $DL_R$. And the reading is accomplished by comparing a current or a voltage of the data line $DL_R$ with a predetermined value.

Additionally, the method for reading the memory array of the present invention is not limited to reading such memory array of the present invention. The method can be performed on any memory array of a symmetrical and self-aligned non-volatile memory structure.

To sum up, the method for reading a memory array allows a user to identify the data stored in a floating gate accurately. Moreover more than one current passageway can be provided to reduce effective resistance between two data lines.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reading a memory array, the memory array comprising a right data line, a left data line, a column of select gates having gates coupled together, a plurality of right floating gates each coupled between a corresponding select gate and the right data line, a plurality of left floating gates each coupled between a corresponding select gate and the left data line, and a plurality of word lines each coupled to a corresponding right floating gate and left floating gate, the method comprising:

turning on the column of select gates;

preprogramming a first right floating gate to a high threshold and a first left floating gate coupled to a same first word line as the first right floating gate to a low threshold;

charging a voltage of the right data line to a first predetermined value;

charging a voltage of the first word line to a second predetermined value which is between the high threshold of the first right floating gate and the low threshold of the first left floating gate;

charging a voltage of a second word line coupled to a second right floating gate to a third predetermined value; and comparing a current of the left data line with a fourth predetermined value.

2. The method of claim 1 further comprising preprogramming a third right floating gate to a low threshold and a third left floating gate coupled to a same third word line as the third right floating gate to a high threshold.

3. A method for reading a memory array, the memory array comprising a right data line, a left data line, a column of select gates having gates coupled together, a plurality of right floating gates each coupled between a corresponding select gate and the right data line, a plurality of left floating gates each coupled between a corresponding select gate and the left data line, and a plurality of word lines each coupled to a corresponding right floating gate and left floating gate, the method comprising:

turning on the column of select gates;

preprogramming a first right floating gate to a high threshold and a first left floating gate coupled to a same first word line as the first right floating gate to a low threshold;

charging a voltage of the right data line to a first predetermined value;

charging a voltage of the first word line to a second predetermined value which is between the high threshold of the first right floating gate and the low threshold of the first left floating gate;

charging a voltage of a second word line coupled to a second right floating gate to a third predetermined value; and comparing a voltage of the left data line with a fourth predetermined value.

4. The method of claim 3 further comprising preprogramming a third right floating gate to a low threshold and a third left floating gate coupled to a same third word line as the third right floating gate to a high threshold.

5. A method for reading a memory array, the memory array comprising a right data line, a left data line, a column of select gates having gates coupled together, a plurality of right floating gates each coupled between a corresponding select gate and the right data line, a plurality of left floating gates each coupled between a corresponding select gate and the left data line, and a plurality of word lines each coupled to a corresponding right floating gate and left floating gate, the method comprising:

turning on the column of select gates;

preprogramming a first right floating gate to a high threshold and a first left floating gate coupled to a same first word line as the first right floating gate to a low threshold;

charging a voltage of the left data line to a first predetermined value;

charging a voltage of the first word line to a second predetermined value which is between the high threshold of the first right floating gate and the low threshold of the first left floating gate;

charging a voltage of a second word line coupled to a second right floating gate to a third predetermined value; and comparing a current or voltage of the right data line with a fourth predetermined value.

6. The method of claim 5 further comprising preprogramming a third right floating gate to a low threshold and a third left floating gate coupled to a same third word line as the third right floating gate to a high threshold.

* * * * *